(12) United States Patent
Smith et al.

(10) Patent No.: US 7,846,624 B2
(45) Date of Patent: Dec. 7, 2010

(54) SYSTEMS AND METHODS FOR DETERMINATION OF FOCUS AND TELECENTRICITY, AMELIORATION OF METROLOGY INDUCED EFFECTS AND APPLICATION TO DETERMINATION OF PRECISION BOSSUNG CURVES

(75) Inventors: Adlai H. Smith, Escondido, CA (US); Robert O. Hunter, Jr., Snowmass Village, CO (US)

(73) Assignee: Litel Instruments, San Diego, CA (US)

( * ) Notice: Subject to any disclaimer, the term of this patent is extended or adjusted under 35 U.S.C. 154(b) by 845 days.

(21) Appl. No.: 11/676,959

(22) Filed: Feb. 20, 2007

(65) Prior Publication Data
US 2007/0206168 A1 Sep. 6, 2007

Related U.S. Application Data

(60) Provisional application No. 60/774,707, filed on Feb. 17, 2006.

(51) Int. Cl.
*G03F 9/00* (2006.01)
*G03C 5/00* (2006.01)

(52) U.S. Cl. .................. 430/22; 430/30; 430/302
(58) Field of Classification Search .......... 430/22, 430/30, 302
See application file for complete search history.

(56) References Cited

U.S. PATENT DOCUMENTS

| | | | |
|---|---|---|---|
| 5,828,455 | A | 10/1998 | Smith et al. |
| 5,978,085 | A | 11/1999 | Smith et al. |
| 6,079,256 | A | 6/2000 | Bareket |
| 6,356,345 | B1 | 3/2002 | McArthur et al. |
| 6,741,338 | B2 | 5/2004 | McArthur et al. |
| 6,963,390 | B1 | 11/2005 | Smith et al. |
| 7,126,668 | B2 | 10/2006 | Smith et al. |
| 2003/0095247 | A1 | 5/2003 | Nakao |
| 2003/0156276 | A1 | 8/2003 | Bowes |
| 2005/0240895 | A1 | 10/2005 | Smith et al. |
| 2005/0243309 | A1 | 11/2005 | Smith et al. |
| 2005/0254040 | A1 | 11/2005 | Smith et al. |
| 2006/0209276 | A1 | 9/2006 | Smith et al. |

FOREIGN PATENT DOCUMENTS

| | | |
|---|---|---|
| WO | WO 2005/106593 | 11/2005 |
| WO | WO 2005/109106 | 11/2005 |

OTHER PUBLICATIONS

Ausschnitt, C., "Distinguishing Dose From Defocus for In-Line Lithography Control", SPIE Vo. 3677, pp. 140-147, 1999.
"Lithography", International Technology Roadmap for Semiconductors, pp. 1-17 2001.
Mack, C., "A Comprehesive Guide to Optical Lithography Simulation", Finle-Divisions of KLA-Tencor, pp. 137-151.
McIntyre, G. et al. "PSM Polarimetry: Monitoring Polarization at 193nm High-NA and Immersion With Phase Shifting Masks", SPIE, vol. 5754-7; pp. 80-91 2005.
Roberts, B., et al, "Quantifying the Capability of a New In-situ Interferometer", 2000.
International Search Report and the Written Opinion of the International Searching Authority dated Feb. 11, 2008 for PCT/US2007/062449.

*Primary Examiner*—Christopher G Young

(57) ABSTRACT

An apparatus and method for the simultaneous determination of focus and source boresighting error for photolithographic steppers and scanners is described. A reticle containing custom arrays of box-in-box test structures specifically designed for performing source or exit pupil division using an aperture plate is exposed onto a resist coated wafer several times. The resulting exposure patterns are measured with a conventional overlay tool. The overlay data is processed with a slope-shift algorithm for the simultaneous determination of both focus and source telecentricity as a function of field position. Additionally, methods for ameliorating metrology induced effects and methods for producing precision Bossung curves are also described. This Abstract is provided for the sole purpose of complying with the Abstract requirement rules, it shall not be used to interpret or to limit the scope or the meaning of the claims.

11 Claims, 42 Drawing Sheets

AA = Alignment attribute

☐ = 40 μm square annulus with 8 μm thick bars (Field Point)

= 80 μm square annulus with 8 μm thick bars (Reference Array)

- 400 μm open squares
- dark field
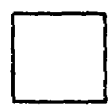
Figure 16

Chief Ray Directions (Entrance and Exit Pupil)

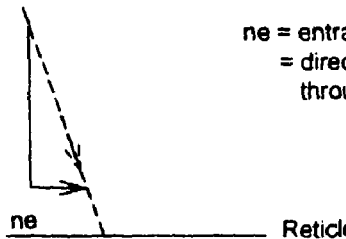

$n_e$ = entrance pupil telecentricity
= direction cosine on reticle side of ray passing through center of aperture stop (chief ray)

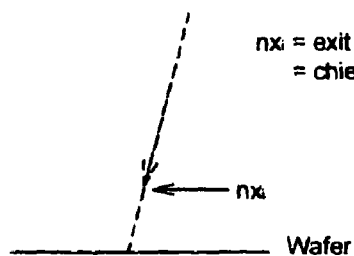

$n_{x_i}$ = exit pupil telecentricity
= chief ray direction cosine on wafer side

Source Boresighting Error

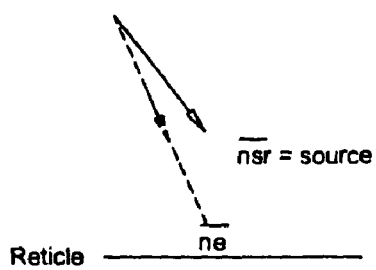

$\overline{n_{sr}}$ = source centroid direction cosine on reticle side

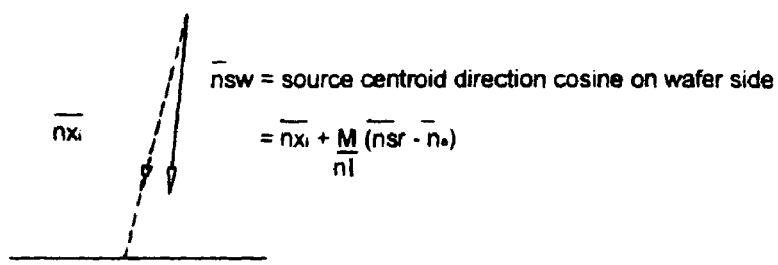

$\overline{n_{sw}}$ = source centroid direction cosine on wafer side $$= \overline{n_{x_i}} + \frac{M}{nI}(\overline{n_{sr}} - \overline{n_e})$$

Figure 20

Simulation Conditions

Shift in Line position at bottom of resist, resist thickness variation

Source:      Conventional, NAs = 0.4, nxtel(wafer) = 0.05
Exit Pupil:  Unobscured, NA = 0.8
Wavelength:  193 nm
Dose:        E/E0 = 2
Mask:        1500 nm line, 2500 nm space
Resist:      0 diffusion, no absorbtion
dx/dz_resist: = 0.05 / sqrt($1.75^2 + 0.05^2$) = 0.0286

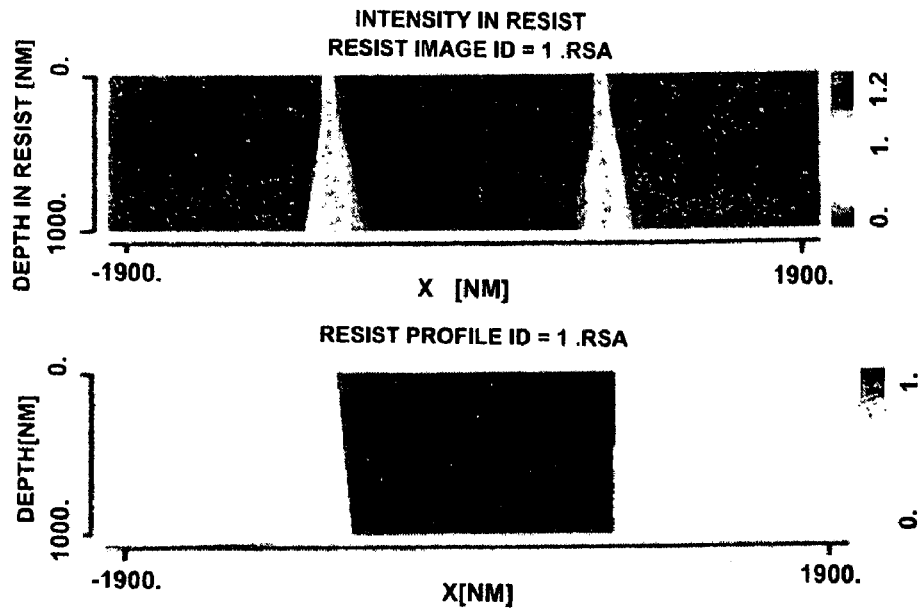

! CD = SIZE AT BOTTOM OF SUBFEATURE [NM].
! XL = LEFT EDGE X POSITION [NM].
! YL = LEFT EDGE Y POSITION [NM].
! XC = CENTER X POSITION [NM].
! YC = CENTER Y POSITION [NM].
! XR = RIGHT EDGE X POSITION [NM].
! YR = RIGHT EDGE Y POSITION [NM].
! QL = LEFT EDGE WALL ANGLE [DEG].
! QR = RIGHT EDGE WALL ANGLE [DEG].
! RL = RESIST LOSS, [NM]
!———————————————————————

| WAVEL | F | FABS | E | EO | E/EO | TH | COMMENT | ADID | CUTID | IDSUB | FT | QCUT | UOO |
|---|---|---|---|---|---|---|---|---|---|---|---|---|---|
| 193 | 0 | 0 | 60 | 30 | 2 | 1000 | A | 1.a1d | 1 | 1 | S | 0 | 0 |
| 193 | 0 | 0 | 60 | 30 | 2 | 1000 | A | 1.a1d | 1 | 2 | L | 0 | 0 |
| 193 | 0 | 0 | 60 | 30 | 2 | 1000 | A | 1.a1d | 1 | 3 | S | 0 | 0 |

| CD | XL | YL | XC | YC | XR | YR | QL | QR | RL |
|---|---|---|---|---|---|---|---|---|---|
| 1326.2 | -2000 | 0 | -1336.9 | 0 | -673.8 | 0 | 90 | 94.97 | |
| 1411.24 | -673.8 | 0 | 31.82 | 0 | 737.44 | 0 | 94.97 | 90.7 | 0 |
| 1262.56 | 737.44 | 0 | 1368.72 | 0 | 2000 | 0 | 90.7 | 90 | |

Figure 25

Shift in Line position at bottom of resist, resist thickness variation
Source: Conventional, NAs = 0.3, nxtel(wafer) = 0.3
Exit Pupil: Unobscured, NA = 0.8
Wavelength: 193 nm
Dose: E/E0 = 2
Mask: 1500 nm line, 2500 nm space
Resist: 0 diffusion, no absorbtion
dx/dz_resist: $= 0.3 / sqrt(1.75^2 + 0.3^2) = 0.1690$
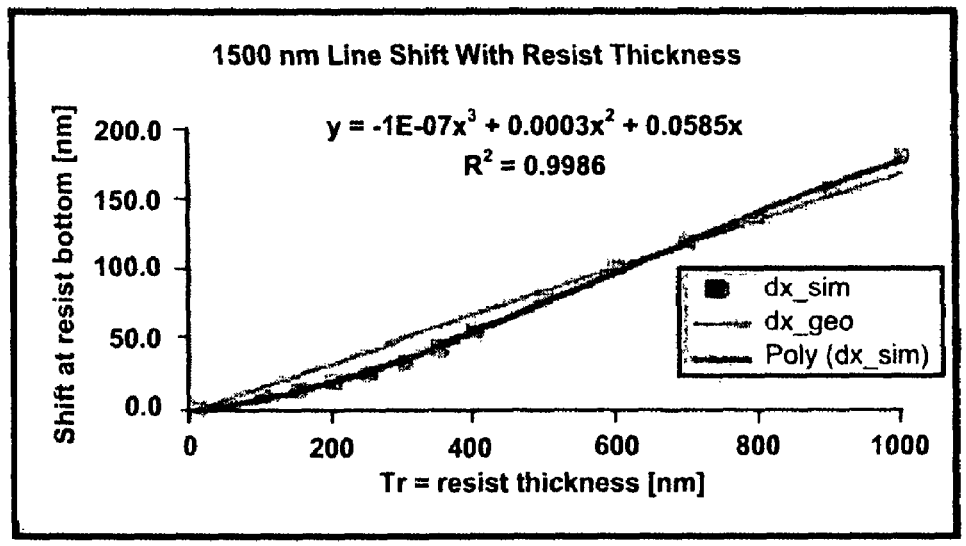
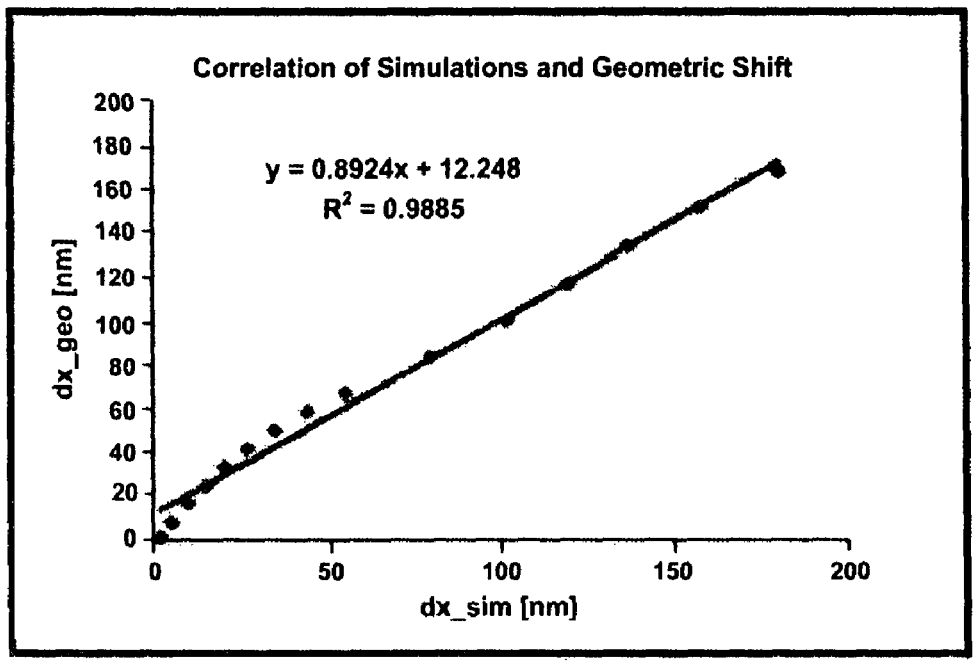
Figure 28

| | |
|---|---|
| RESIST THICKNESS = | 500 |
| NREAL = | 1.8 |
| RESIST MODEL = | GAMMA_6 |
| MASK = | 1200NM ISOSPACE |
| NA = | 0.6 |
| SIGMA = | 0.65 |
| WAVELENGTH = | 248 |
| ABBS = | 0.05 RAD OF A8 |

- 228 x 154 total size at wafer
- 912 x 616 $\mu m^2$ at reticle
- D = dark field, B = bright field section
- 90, 110, etc. = process node size test structures
- Z = AAC location
- ID = text identification of field point location

SYSTEMS AND METHODS FOR DETERMINATION OF FOCUS AND TELECENTRICITY, AMELIORATION OF METROLOGY INDUCED EFFECTS AND APPLICATION TO DETERMINATION OF PRECISION BOSSUNG CURVES

CROSS REFERENCE TO RELATED APPLICATION:

This application claims the benefit of U.S. Provisional application Ser. No. 60/774,707 Feb. 17, 2006. The contents of which are incorporated by reference in its entirety.

OTHER REFERENCES

The below listed sources are incorporated herein by reference in their entirety.

| # | Title | Authors | Journal | Pages | Date |
|---|---|---|---|---|---|
| 63 | Distinguishing Dose from Defocus for In-Line Lithography Control | C. Ausschnitt | SPIE Vol. 3677 | 140:147 | 1999 |
| 147 | Quantifying the Capability of a New In-situ Interferometer | B. Roberts, et al. | | | 2000 |
| 303 | A Comprehensive Guide To Optical Lithography Simulation | C. Mack | Finle--division of KLA-Tencor | 137:151 | |
| 229 | International Technology Roadmap for Semiconductors, 2001 Edition, Lithography | | ITRS, 2001 Edition | 1:17 | 2001 |
| 459 | PSM Polarimetry: Monitoring Polarization at 193 nm High-NA and Immersion with Phase Shifting Masks | G. McIntyre, et al. | SPIE Vol. 5754-7 | 80:91 | 2005 |
| 5,828,455 | Apparatus, Method of Measurement and Method of Data Analysis For Correction of Optical System | A. Smith, et. Al. | U.S. Pat. No. 5,828,455 | | 1992 |
| 6,079,256 | Overlay Alignment Measurement of Wafers | N. Bareket | U.S. Pat. No. 6,079,256 | | 2000 |
| 6,356,345 B1 | In-Situ Source Metrology Instrument and Method of Use | B. McArthur, et. Al | U.S. Pat. No. 6,356,345 | | 1999 |
| 2005/0240895 | Method of Emulation of Lithographic Projection Tools | A. Smith, et. al | U.S. Publication No. 2005/024895 | | 2004 |
| 2005/0243309 | Apparatus and Process for Determination of Dynamic Lens Field Curvature | A. Smith, et. al | U.S. Publication No. 2005/0243309 | | 2004 |
| 7,126,668 | Apparatus and Process for Determination of Dynamic Scan Field Curvature | A. Smith, et. al | U.S. Pat. No. 7,126,668 | | 2004 |

FIELD OF THE INVENTION

The present invention relates generally to the field of semiconductor Ultra Large Scale Integration (ULSI) manufacturing and more specifically to techniques for characterizing the performance of photolithographic machines and processes.

BACKGROUND OF THE INVENTION

Background and Related Art

Typically one uses the term focal plane deviation (FPD) to measure the extent of lens or system dependent focal error over the entire lithographic imaging field. Lithographic systems with low to moderate amounts of focal plane deviation typically image better than those with gross amounts of focal plane deviation. Typically, the focal plane deviation associated with a photolithographic stepper or scanner is measured with some type of special lithographic imaging technique using special reticle or mask patterns (See "Distinguishing Dose from Defocus for In-Line Lithography Control", C. Ausschnitt, SPIE Vo. 3677, pp. 140-147, 1999; "Quantifying the Capability of a New In-situ Interferometer", B. Roberts et al, San Diego 2000 and U.S. Pat. No. 6,356,345, for example). For fabs, Bossung plots (focus vs. CD) are typically used as process aids to find the best focus as a function of exposure dose and CD (critical dimension). These Bossung plots contain plenty of inherent error (unknown focus budget effects) yet are still useful. While some focusing error or FPD stems from lens aberrations, other sources of focusing error include: stage non-flatness, stage tilt, wafer tilt, wafer surface irregularities, and scanner synchronization error (z). Traditional methods such as those mentioned above can usually determine FPD but fail to separate-out the effects of other sources including scanner noise and wafer non-flatness. In addition, most traditional methods are not capable of separating-out systematic error from random error—which is really needed for process control applications. As the semiconductor industry pushes the limits of optical lithography, focus or the effective z-height variation of the wafer plane surface from that ideal position which provides the highest contrast or otherwise optimal images is becoming difficult to control and measure. Extremely tight focus tolerance has lead to novel methods to help improve the lithographic depth of focus as well as providing improved methods for determining focus and focal plane deviation. A first example is given by Ausschnitt supra where a special reticle pattern containing features sensitive to exposure and focus shifts is used to separate-out dose effects from focus for lithographic processes. Another example can be found in U.S. Pat. No. 5,303,002 where longitudinal lo chromatic aberrations can be used to improve the overall lithographic depth of focus and improve focus latitude. A more interesting example can be found in Smith (see U.S. Publication No. 2005/0243309 and U.S. Pat. No. 7,126,668) where a special reticle containing overlay targets is used to determine dynamic lens field curvature to high accuracy in the presence of wafer non-flatness and scanner noise. A final example and used as part of U.S. Publication No. 2005/0243309 and U.S. Pat. No. 7,126,668, can be found in U.S. Pat. No. 5,828,455 where an in-situ interferometer is used to determine Zernike coefficients using box-in-box structures for the proper characterization of lens aberrations including focus.

While we have stressed the importance of determining focus, maintaining focus control, and possibly improving the useable depth of focus we should also mention that most lithographic scanner systems suffer from several types of telecentricity error including source boresighting error and telecentricities associated with both the entrance and exit pupil. For source telecentricity, error in the source centroid (energy centroid) in the presence of focusing error leads to problematic overlay error and magnification error since misaligned sources produce rays that image reticle features at a net angular off-set through the resist. Overlay error, or the positional misalignment between patterned layers is an important concern as both the pitch and size of lithographic features shrink since misaligned patterns are more likely to produce open circuit conditions or poor device performance (Reference U.S. Pat. No. 6,079,256). Finally, since both overlay and focus control specifications will soon reach a few nanometers (Reference International Technology Roadmap for Semiconductors, 2001 Edition—Lithography", ITRS, 2001 Edition, pp. 1-17) methods that can accurately measure and separate-out components related to focus and source telecentricity will be highly desirable and required.

SUMMARY OF THE INVENTION

Having stressed the need for accurate methods of extracting focus and telecentricity we now give a brief description of the preferred embodiment (FIG. 17 shows the exposure sequence for the two embodiments of the present invention) where we simultaneously extract both focus (z-height with field position or FPD) and source boresighting error. A reticle containing an aperture plate with holes and arrays of box-in-box test structures (alignment attributes or overlay targets) is exposed onto a resist coated wafer several times—using positional stage shifts between exposures (see FIGS. 1 and 11). The reticle with aperture plate is constructed in such a way as to perform source or exit pupil division during the exposure (see theory section below). The resulting exposure patterns are measured with a conventional overlay tool. The overlay data is processed with a slope-shift algorithm for the simultaneous determination of focus and source telecentricity, as a function of field position. Knowledge of focus and source telecentricity as a function of field position allows for the correction of overlay error and improved lithographic performance (improved contrast) when focus and telecentricity metrics are entered into the machine subsystem control hardware or appropriate optical lithography simulation software packages. The methods of the preferred embodiment can be applied to production scanners during set-up and the results of the calculations can be used to create accurate Bossung curves.

BRIEF DESCRIPTION OF THE DRAWINGS

Various embodiments of the present invention taught herein are illustrated by way of example, and not by way of limitation, in the FIGs of the accompanying drawings, in which:

FIG. 16 shows the plan view of ZED, extra dose structures;

FIG. 19b shows 1-d intensity profiles in direction cosine space corresponding to FIG. 19a;

FIG. 20 shows the relation of source and entrance/exit pupil telecentricities;

FIG. 25 shows typical output results for a single simulation;

FIG. 28 shows simulation conditions, shift correlation with resist thickness, and correlation of simulations with geometric shift;

Figure 1:
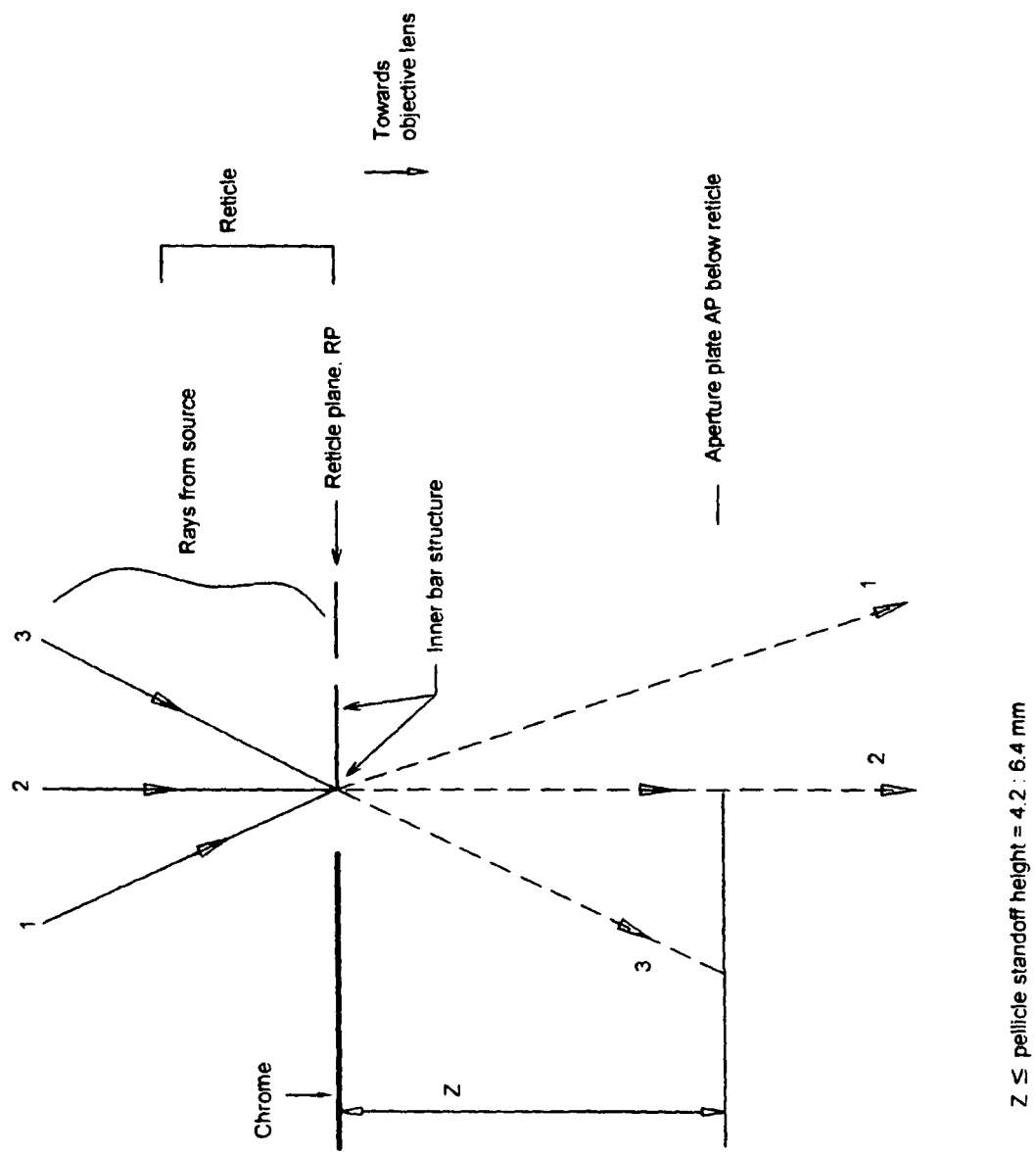
FIG. 1 shows the hardware layout cross-section for the first embodiment using exit pupil division.

It will be recognized that some or all of the FIGs are schematic representations for purposes of illustration and do not necessarily depict the actual relative sizes or locations of the elements shown. The FIGs are provided for the purpose of illustrating one or more embodiments of the invention with the explicit understanding that they will not be used to limit the scope or the meaning of the claims

DETAILED DESCRIPTION OF THE INVENTION

In the following paragraphs, the present invention will be described in detail by way of example with reference to the attached drawings. While this invention is capable of embodiment in many different forms, there is shown in the drawings and will herein be described in detail specific embodiments, with the understanding that the present disclosure is to be considered as an example of the principles of the invention and not intended to limit the invention to the specific embodiments shown and described. That is, throughout this description, the embodiments and examples shown should be considered as exemplars, rather than as limitations on the present invention. Descriptions of well known components, methods and/or processing techniques are omitted so as to not unnecessarily obscure the invention. As used herein, the "present invention" refers to any one of the embodiments of the invention described herein, and any equivalents. Furthermore, reference to various feature(s) of the "present invention" throughout this document does not mean that all claimed embodiments or methods must include the referenced feature(s).

Figure 17:
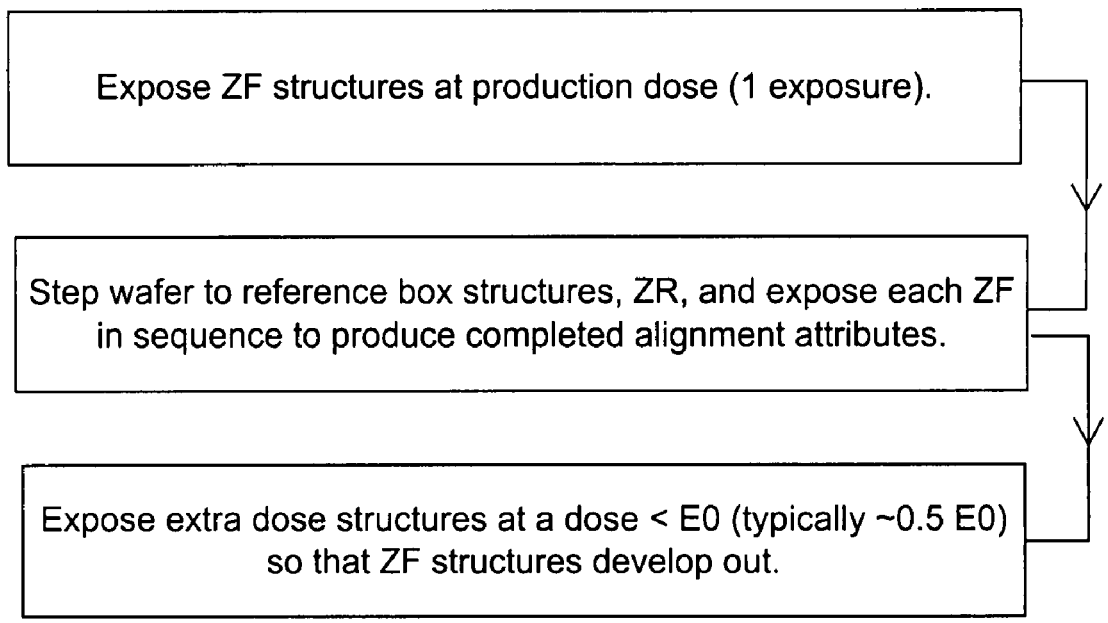
FIG. 17 shows the exposure sequence for ZTEL.
Figure 40:
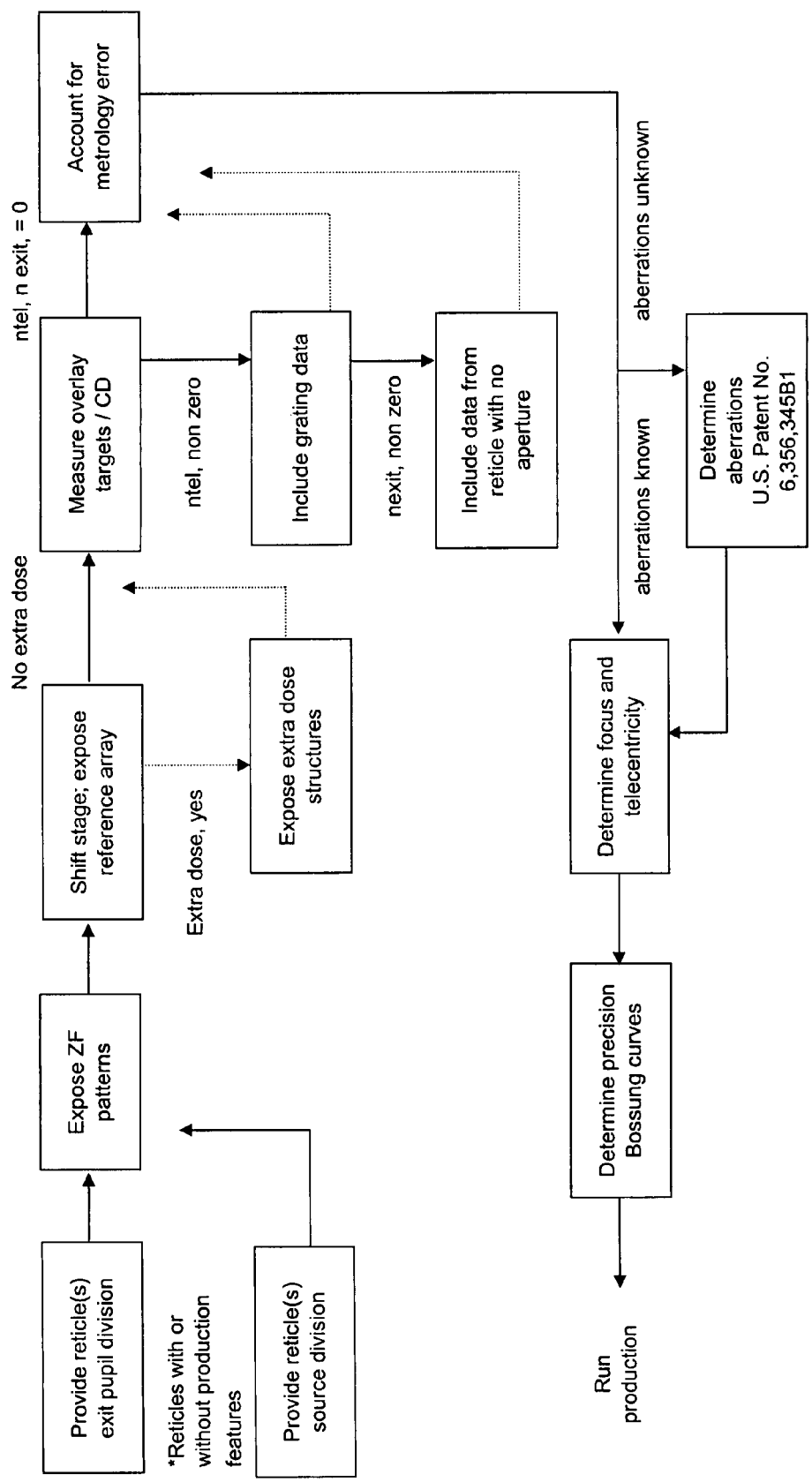
FIG. 40 is a flow diagram and decision tree for 18 preferred embodiments.

For the purposes of clarity the terms ZF cells and ZF structures used herein refer to arrays of box-in-box test structures and aperture plate. The overall flow diagram for an exemplary embodiment is illustrated in FIGS. 17 and 40.

Exit Pupil (or Source) Division

Figure 8:
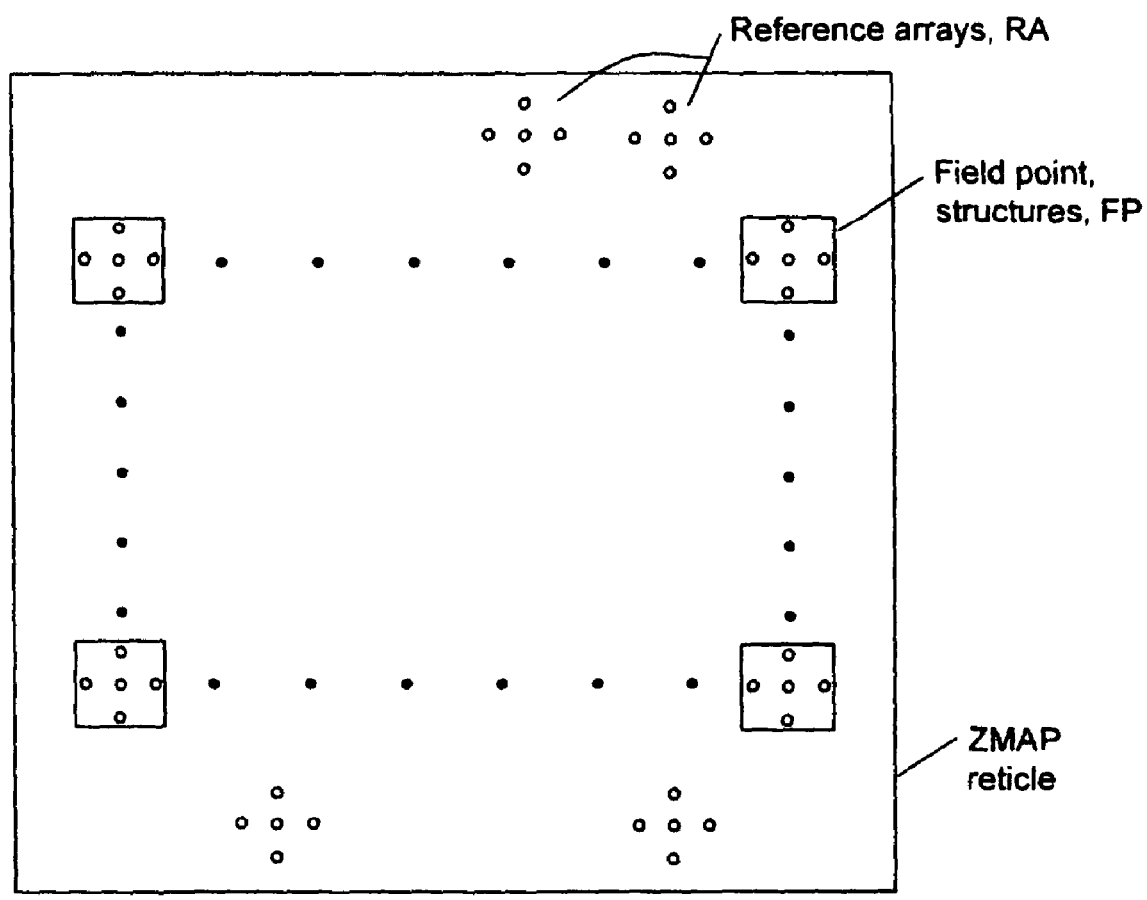
FIG. 8 shows the reticle plan view layout for exit pupil division ZTEL, square aperture holes.
Figure 13:
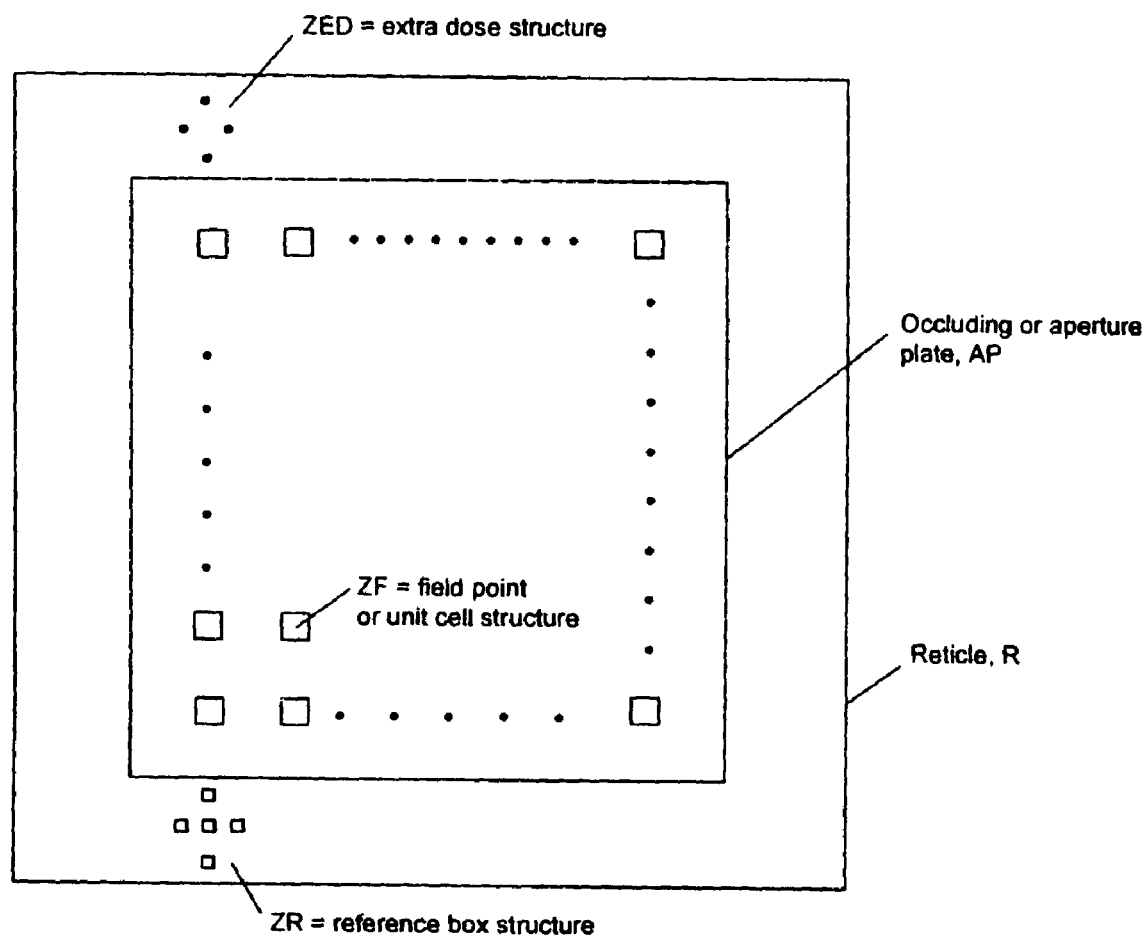
FIG. 13 shows the reticle plan view for source division ZTEL with square aperture holes.

Step 1: a reticle containing arrays of box-in-box test structures is provided (FIGS. 8 and 13).

Step 2: expose first large area array of ZF cells (FIG. 6 or 15) at nominal exposure dose for large features.

Figure 18:
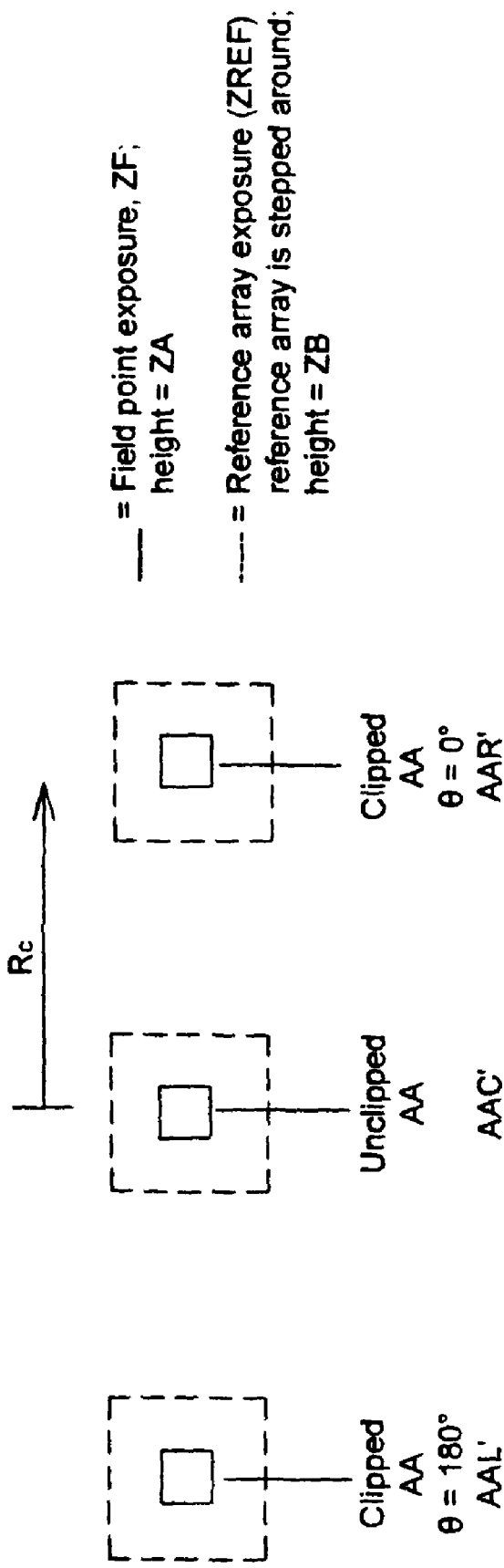
FIG. 18 shows completed alignment attributes after ZF, ZREF and possible ZED exposures.

Step 3 shift wafer stage to align reference arrays (ZREF FIG. 10) over ZF cells (FIG. 18).

Step 4: if required, expose extra dose structures (ZED) around clipped (AAR, AAL) structures.

Step 5: measure the resulting exposure patterns with a conventional overlay tool.

Step 6: enter data into analysis engine and solve for focus and source telecentricity.

This invention consists of the following exemplary 18 embodiments (see FIG. 40 for the flow of the preferred embodiments):

| Emb. # | Method |
|---|---|
| 1 | determination of focus and source boresighting error using Exit Pupil Division |
| 2 | determination of focus and source boresighting error using Source Division |
| 3 | determination of focus and source boresighting error in the presence of entrance pupil telecentricity using grating patterns and Exit Pupil Division |
| 4 | determination of focus and source boresighting error in the presence of entrance pupil telecentricity using grating patterns and Source Division |
| 5 | determination of focus, source boresighting, entrance pupil telecentricity, and exit pupil telecentricity using Exit Pupil Division - with and without aperture plate |
| 6 | determination of focus, source boresighting, entrance pupil telecentricity, and exit pupil telecentricity using Source Division - with and without aperture plate |
| 7 | determination of focus and source boresighting error in the presence of aberrations using Exit Pupil Division |
| 8 | determination of focus and source boresighting error in the presence of aberrations using Source Division |
| 9 | elimination of metrology induced error using Exit Pupil Division |
| 10 | elimination of metrology induced error using Source Division |
| 11 | intrinsic removal of metrology induced error using line-space attributes using Exit Pupil |
| 12 | intrinsic removal of metrology induced error using line-space attributes using Source Division |
| 13 | intrinsic removal of metrology induced error using bright and dark-field attributes using Exit Pupil Division |
| 14 | intrinsic removal of metrology induced error using bright and dark-field attributes using Source Division |
| 15 | accurate Bossung curves using Exit Pupil Division and Apparatus |
| 16 | accurate Bossung curves using Source Division and Apparatus |
| 17 | determination of focus and telecentricity components using ZMAP and Exit Pupil Division |
| 18 | determination of focus and telecentricity components using ZMAP and Source Division |

Theory and Detail:

$1^{st}$ Embodiment

Exit Pupil Division

Figure 2A:
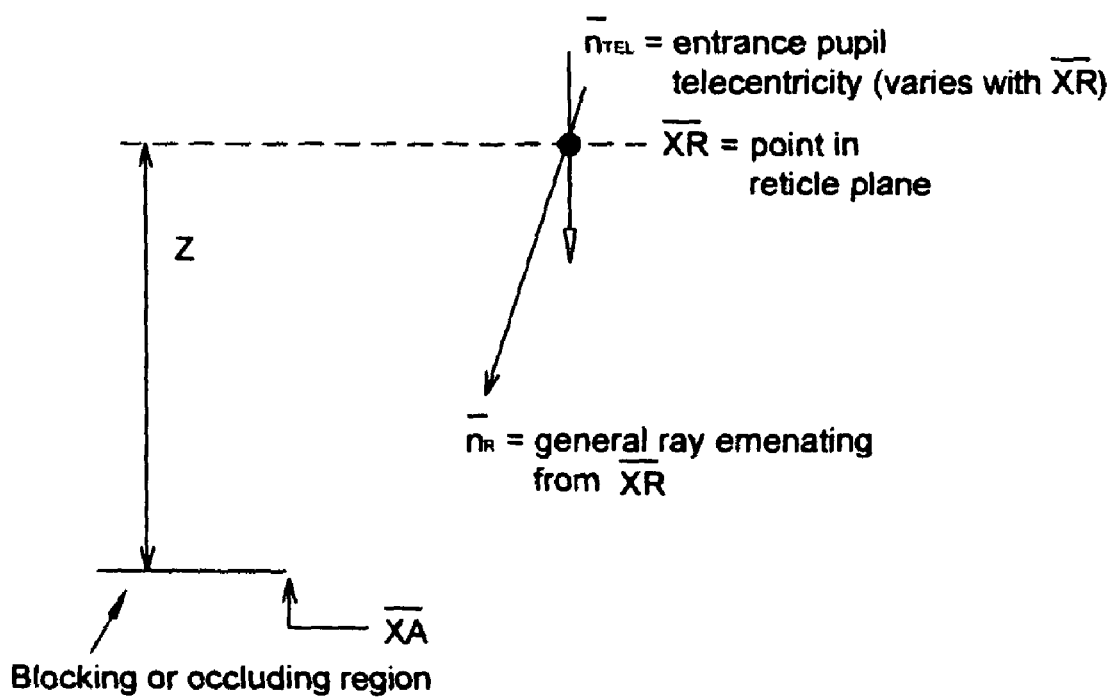
FIG. 2a shows coordinates and notation relating to FIG. 1.
Figure 2B:
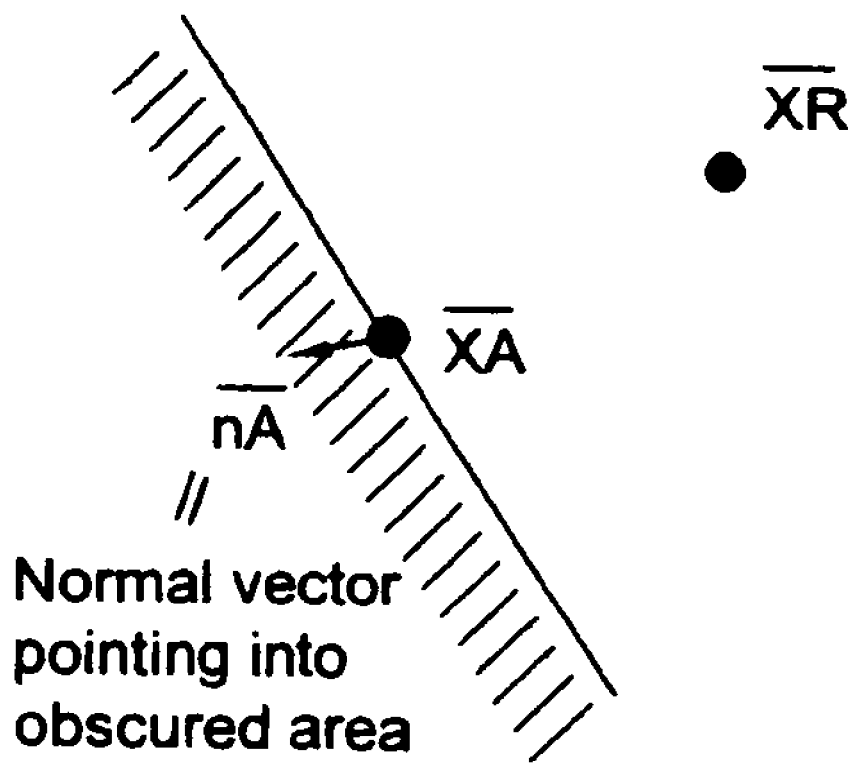
FIG. 2b is a plan view and coordinates for FIG. 1.

FIG. 1 shows a cross section view of an exit pupil division arrangement (for extracting both focus and source telecentricity) that clips rays (1:3) emerging from reticle plane RP at aperture plate AP. Thus, of marginal rays 1 and 3, 3 is intercepted and occluded by AP while 1 will pass through the scanner objective lens and onto the wafer plane (not shown). Axial ray 2 is just passed by AP. FIGS. 2a and 2b show respectively cross sectional and plan views with coordinate conventions describing the exit pupil division arrangement of FIG. 1. The symbols in FIGS. 2a and 2b mean:

$\overline{XR}$=transverse position of general point in reticle (shown below differently)

$\overline{XA}$=transverse position of edge point of occluding edge on aperture plate Z=reticle to aperture plate distance (perpendicular to respective planes)

$\overline{n}_{TEL}$=transverse direction cosines of entrance pupil chief ray on reticle side $\overline{n}_R$=transverse direction cosines of general ray emanating from point $\overline{XR}$ on reticle $\overline{nA}$=normal vector in aperture plane pointing into occluding area of aperture plate AP.

With this, and denoting $\overline{X}$=transverse position of ray intersection in aperture plane, we have:

$$\overline{X} = \overline{X}_R + Z\frac{\overline{n}_R}{\sqrt{1-n_R^2}} \qquad \text{Equation 1}$$

Clipping by the aperture plate will limit the rays that can enter the imaging system (stepper or scanner) according to:

$$\overline{nA} \cdot \frac{(\overline{XA} - \overline{XR})}{Z} \geq \frac{\overline{n}_R \cdot \overline{n}_A}{\sqrt{1-n_R^2}} \qquad \text{Equation 2}$$

For an image side telecentric system (steppers and scanners used in ULSI photolithography) the exit pupil or image side direction cosine, $\overline{nx}$, (non-immersion system) is:

$$\overline{nx} = M(\overline{n}_R - \overline{n}_{TEL}) \qquad \text{Equation 3}$$

and the non-occlusion condition (Equation 2) becomes:

$$\overline{nA} \cdot \frac{(\overline{XA} - \overline{XR})}{Z} \geq \frac{\overline{nA} \cdot \left(\frac{\overline{n}_X}{M} + \overline{n}_{TEL}\right)}{\sqrt{1 - \left(\frac{\overline{n}_X}{M} + \overline{n}_{TEL}\right)^2}} \qquad \text{Equation 4}$$

For a point on the reticle located directly above the aperture plate edge ($\overline{XA}=\overline{XR}$) and an aperture that covers the left half plane ($\overline{nA}=1,0$), we get:

$n1_x \geq -M \cdot n1_{TEL}$ (see FIG. 3) and M=system de-magnification  Equation 5

Figure 3:
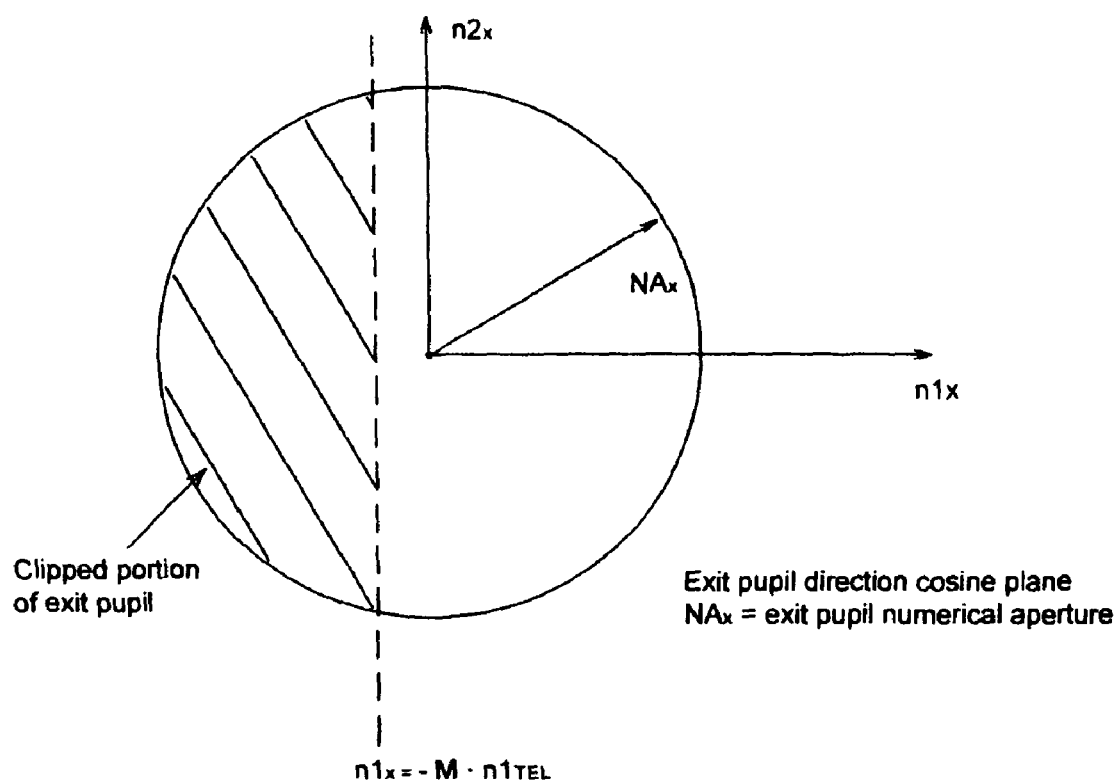
FIG. 3 shows the effect of aperture plate below reticle in obstructing or occluding rays emanating from reticle plane RP.

So the effect of the aperture plate is to clip approximately the left half of the exit pupil (FIG. 3). The utility of this for the reticle patterns used in this embodiment is that changes in z-height ($\Delta Z$=delta-focus) produce a transverse shift ($\overline{\Delta X}$) of a feature (and we are here thinking of the inner or outer portion of a bar-in-bar or box-in-box pattern as well as other alignment attributes) of:

$$\overline{\Delta X} = \Delta Z \cdot \frac{d\overline{X}}{dZ} \qquad \text{Equation 6}$$

which we use to find both focus and source telecentricity.

Figure 4:
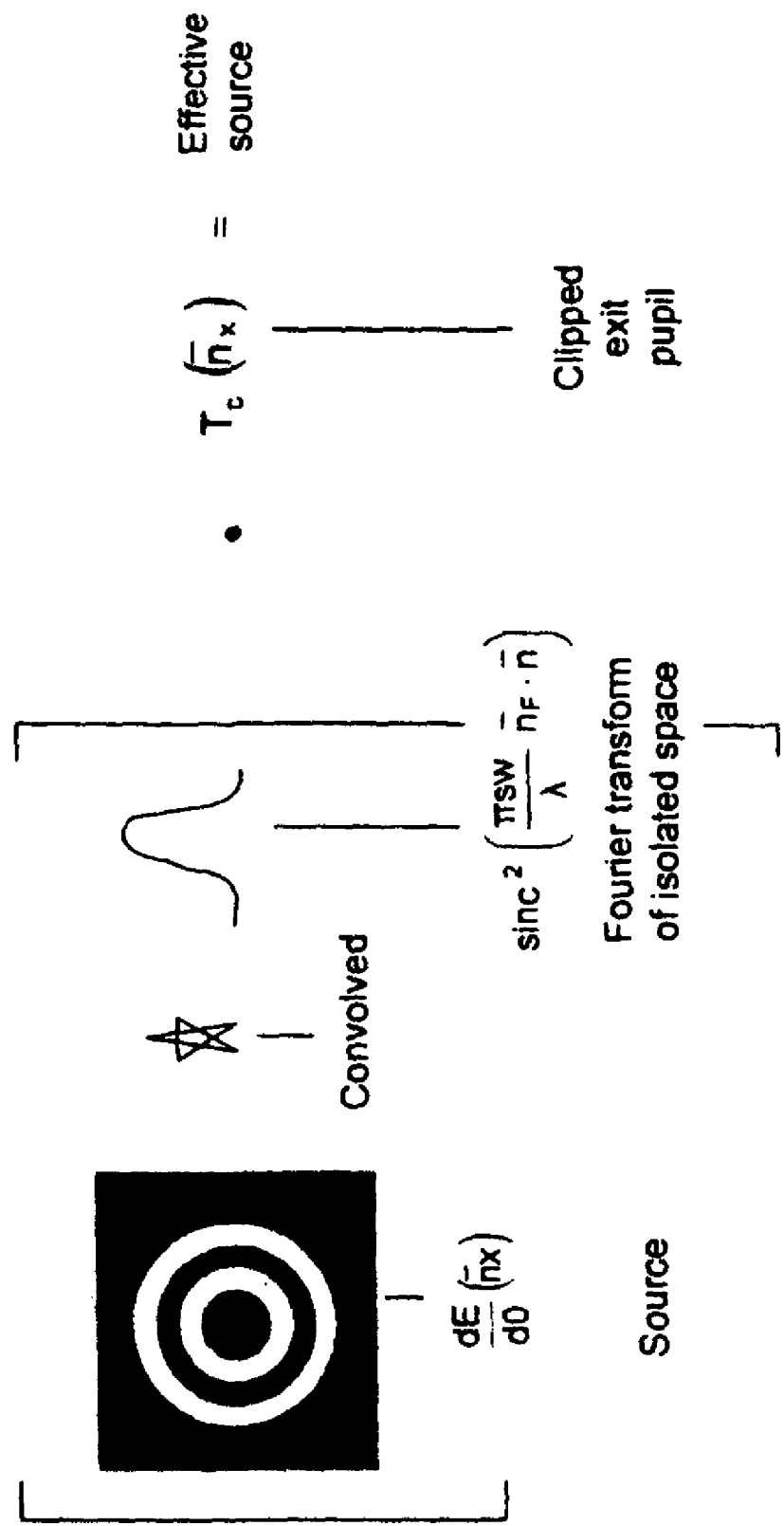
FIG. 4 is a graphical illustration of effective source calculation for determining $$\frac{d\bar{x}}{dz};$$

In a first approximation, $$\frac{d\overline{X}}{dZ}$$

is determined by the centroid of the source convolved with the mask feature Fourier transform as modified and clipped by the exit pupil (Equation 4). In terms of the effective source ($S(\overline{nx})$) the instrumental slope shift ($d\overline{X}/dZ$) induced by aperture plate AP is:

$$\frac{d\overline{X}}{dZ} = \frac{(<nx>, <ny>)}{[<nx>^2 + <ny>^2 + <nz^2>]^{1/2}} \qquad \text{Equation 7}$$

where:

$$\langle nx,ny,nz \rangle = \int d\Omega \overline{n}(nx,ny,nz) S(\overline{n}) \qquad \text{Equation 8}$$

and, FIG. 4, expressed as an equation for the effective source is:

Equation 9

$$S(\overline{n}_X) = T(\overline{n}_X) \, C(\overline{n}_X) \int d^2m \frac{dE}{do}(\overline{n}x + \overline{m}) \, \text{sinc}^2\left(\frac{\pi SW}{\lambda} \overline{n}_F \cdot \overline{m}\right)$$

- Square of Fourier Transform for an isolated space
- Source radiant intensity
- Clipping factor
- Unclipped exit pupil transmission and $\overline{n}_F = (1, 0)$ for vertical space $\phantom{\overline{n}_F} = (0, 1)$ for horizontal space SW=isolated space width $\lambda$=scanner operating wavelength.

The clipping factor $C(\overline{n}_x)$ is just the non-occlusion condition (Equation 4), i.e.:

$$C(\overline{n}_X) = \begin{cases} 1 & \text{if inequality of Equation 4 obtains} \\ 0 & \text{otherwise} \end{cases} \qquad \text{Equation 10}$$

To get a rough estimate of the instrumental slope shift, $$\frac{d\overline{X}}{dZ},$$

we let $n_{TEL}=0$ (typically small) and ignore convolution. This leads to, for a conventional source of numerical aperture NAs on the wafer side:

$$\frac{d\overline{X}}{dZ} \approx \int_{-\pi/2}^{\pi/2} d\theta \int_0^{NAs} dn \cdot n \, n \cos\theta \Big/ \int_{-\pi/2}^{\pi/2} d\theta \int_0^{NAs} dn \cdot n \qquad \text{Equation 1}$$

$$= 2 \cdot \frac{1}{3} NA_S^3 \Big/ \pi \frac{NA_S^2}{2}$$

$$= \frac{4}{3\pi} NA_S$$

Table 1 (infra) shows the slope shift as computed from Equation 11 for several conventional sources:

TABLE 1

| NAs | .3 | .6 | .8 |
|---|---|---|---|
| $\frac{dX}{dZ}$ [nm/nm] | .13 | .25 | .34 |

Equation 11 and the results in Table 1 are for large $$\left(SW \gg \frac{\lambda}{2NA_X}\right)$$

features. Decreasing the feature size (SW) and/or using grating arrangements (see U.S. Pat. No. 6,079,256) will increase the transverse size (in nx) of effective source S(nx) (Equation 9) and thereby increase slope shift $d\overline{X}/dZ$. In general and in the practice of this invention, the best values, e.g., values that should be used in a commercial lithography software package, need to be computed directly from a simulation of the situation that includes all known (error or performance) factors. That is, (see U.S. Pat. No. 6,356,345 B1) sources, aberrations (see U.S. Pat. No. 5,828,455), exit and entrance telecentricity, resist effects, etc. (vide infra).

Figure 5:
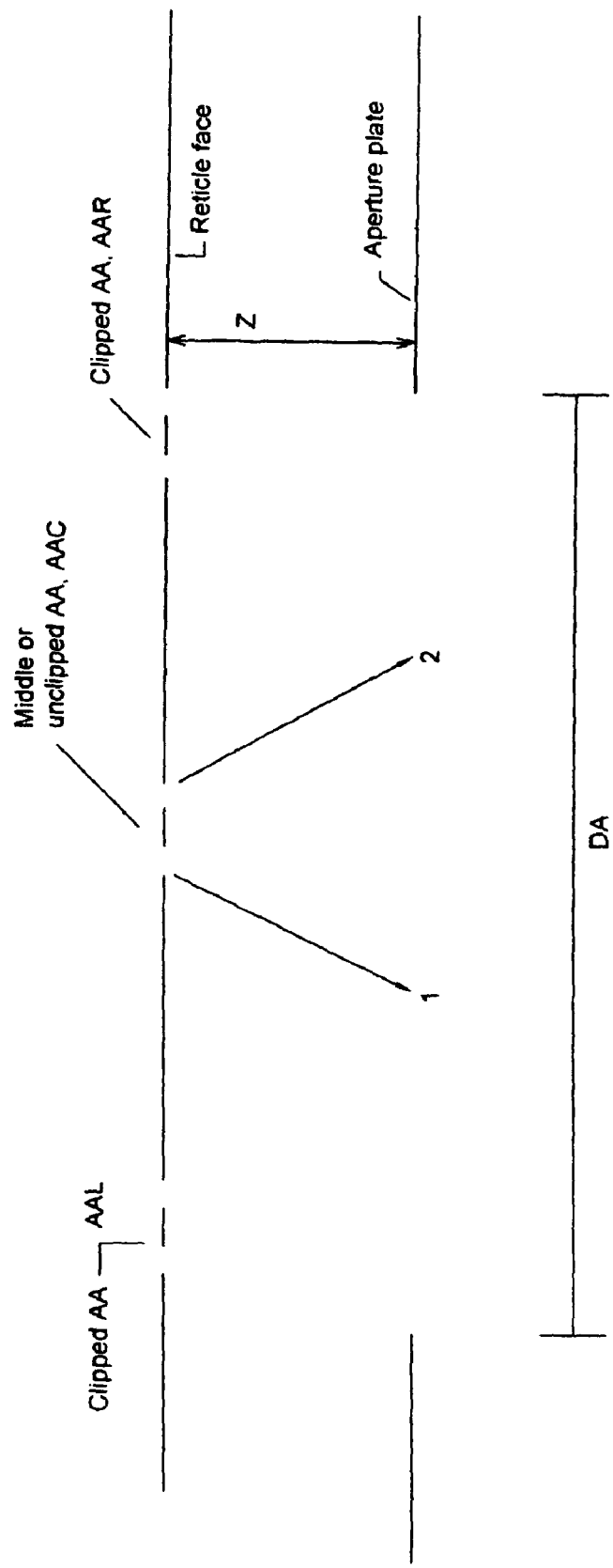
FIG. 5 shows the hardware layout cross-section for the first embodiment using exit pupil division.

FIG. 5 shows an x-cross section of the complete unit cell of a device (ZTEL) utilizing exit pupil division. Middle or unclipped bar pattern (also called alignment attribute or AA) is situated far enough from the edges of the opening in the aperture plate that extreme rays 1 and 2 are not intercepted by it. Extreme ray direction at reticle is set by entrance pupil size and telecentricity and is:

$$n_R = \frac{NA}{M} + n_{TEL} \quad \text{Equation 12}$$

An important role for middle or unclipped alignment attribute AAC is that when combined with clipped alignment attribute AAL and AAR, we can extract the source boresighting or telecentricity error $\overline{n}BS$ (see discussion in source division arrangement below). For central alignment attribute (AAC) of transverse size DAA we require for the minimum aperture hole size, DA $$DA > DAA + 2 \cdot Z \cdot \frac{nR}{\sqrt{1-n_R^2}} \quad \text{Equation 13}$$

(with Z as the aperture plate distance)

Exemplary aperture hole sizes are shown in Table 2 below. M=4, $n_{TEL}$=0.03 (largest typical non-telecon), DAA=0.05mm (~10 μm box with 2 μm wide spaces)

TABLE 2

Table of Minimum Aperture Hole Sizes, DA, for Exit Pupil Division ZTEL.

| | $NA_X$ = .95 | $NA_X$ = 1.5 |
|---|---|---|
| Z = 1 mm | .605 | 0.936 |
| Z = 2 | 1.16 | 1.82 |
| Z = 5 | 2.83 | 4.48 |

Figure 6:
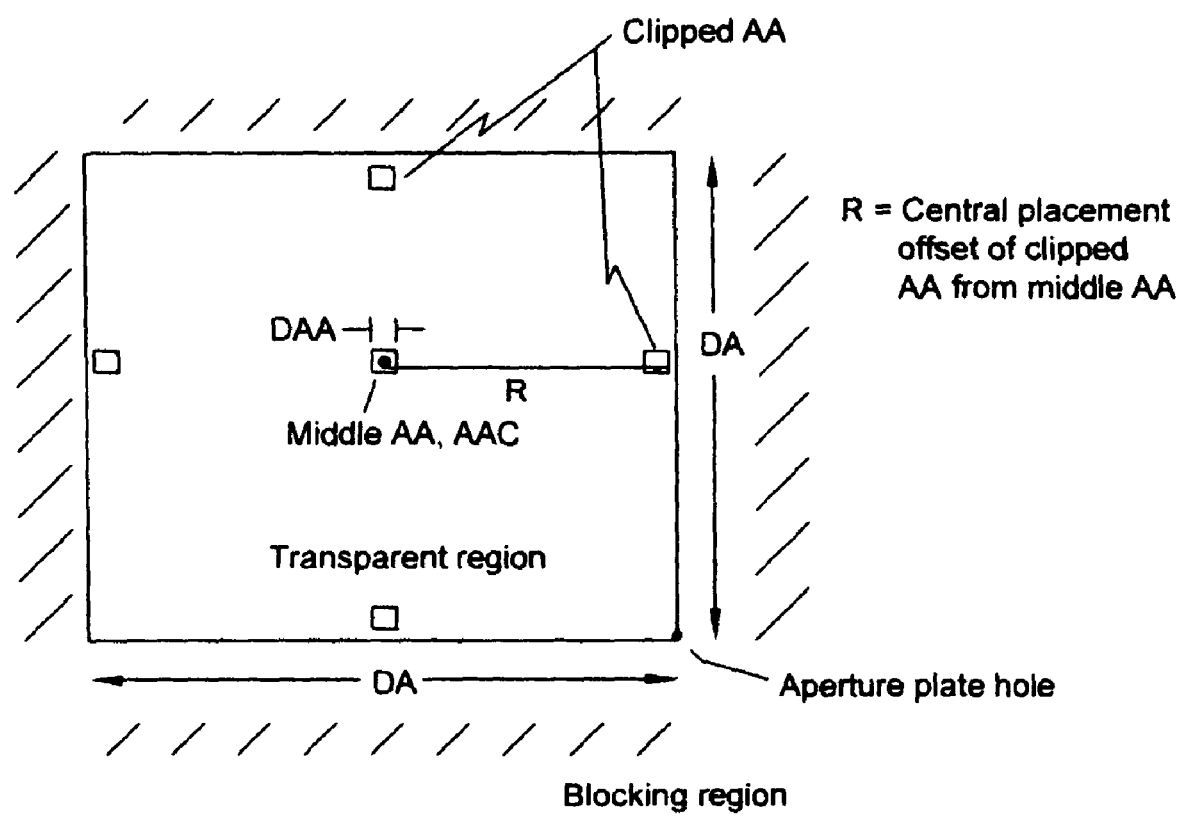
FIG. 6 shows the plan view of a single field point, exit pupil division ZTEL, square aperture hole.
Figure 7:
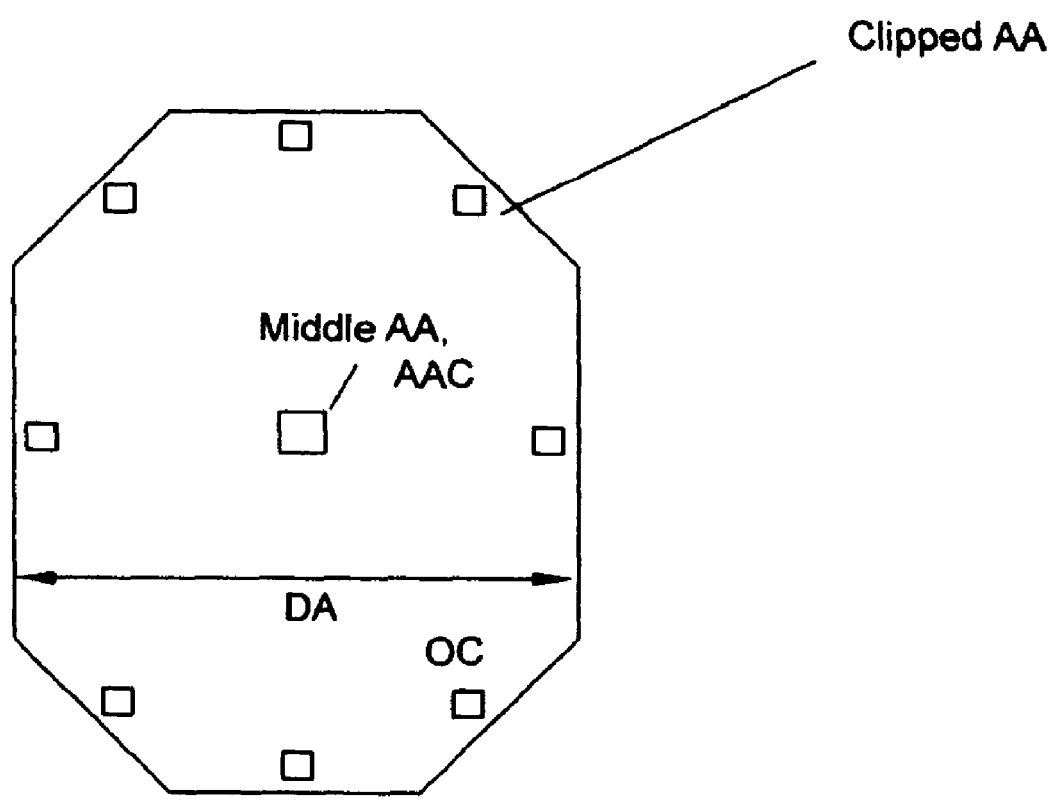
FIG. 7 shows the plan view of a single field point, exit pupil division arrangement, octagon.

FIG. 6 shows a plan view of single field point or unit cell exit pupil division ZTEL with a square hole in the aperture plate for the preferred embodiment. In another embodiment, FIG. 7 shows a plan view of single field point, exit pupil division arrangement, octagon aperture hole.

In this case, clipped alignment attributes are arranged on all eight sides of octagonal opening OC. FIG. 8 shows a reticle plan view layout for an exit pupil division ZTEL with square aperture holes. The RA are reference arrays which are AAs (alignment attributes) that are complimentary to the field point AAs (e.g., inner bar AAs at field points→ outer bar structures for reference array AAs). The reference arrays, RA, must not be obscured in any way by the aperture plate, so the minimum transverse distance of aperture plate AP from any reference array structure is given by:

$$d\min = \frac{DAA}{2} + \frac{Z \cdot nR}{\sqrt{1-n_R^2}} \text{ where } Z \text{ is the aperture offset} \quad \text{Equation 14}$$

and nR is the maximum reticle side direction cosine which is:

$$nR = \frac{NA_X}{M} + n_{TEL} \quad \text{Equation 15}$$

with $NA_x$ being the maximum exit pupil numerical aperture, M the reduction magnification, and $n_{TEL}$ the maximum entrance pupil telecentricity angle.

Figure 9:
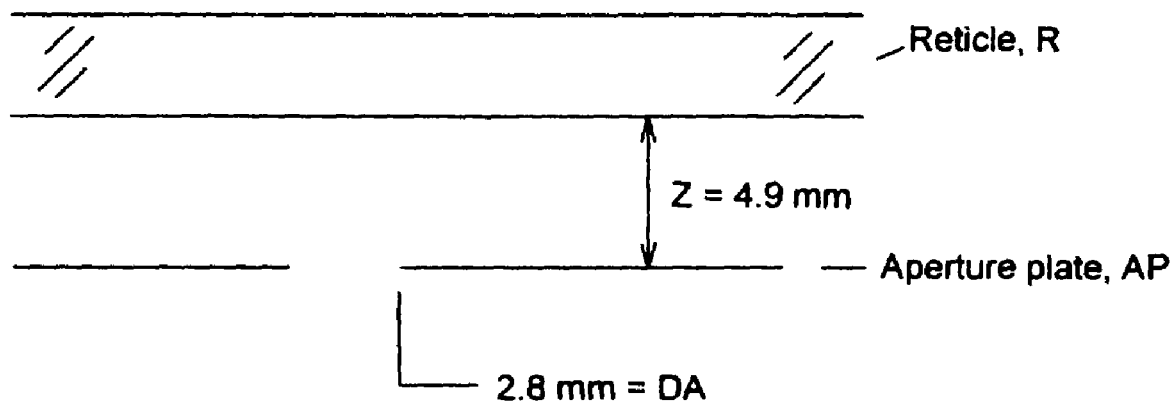
FIG. 9 shows unit cell cross section for exit pupil division arrangement, ZTEL.
Figure 10:
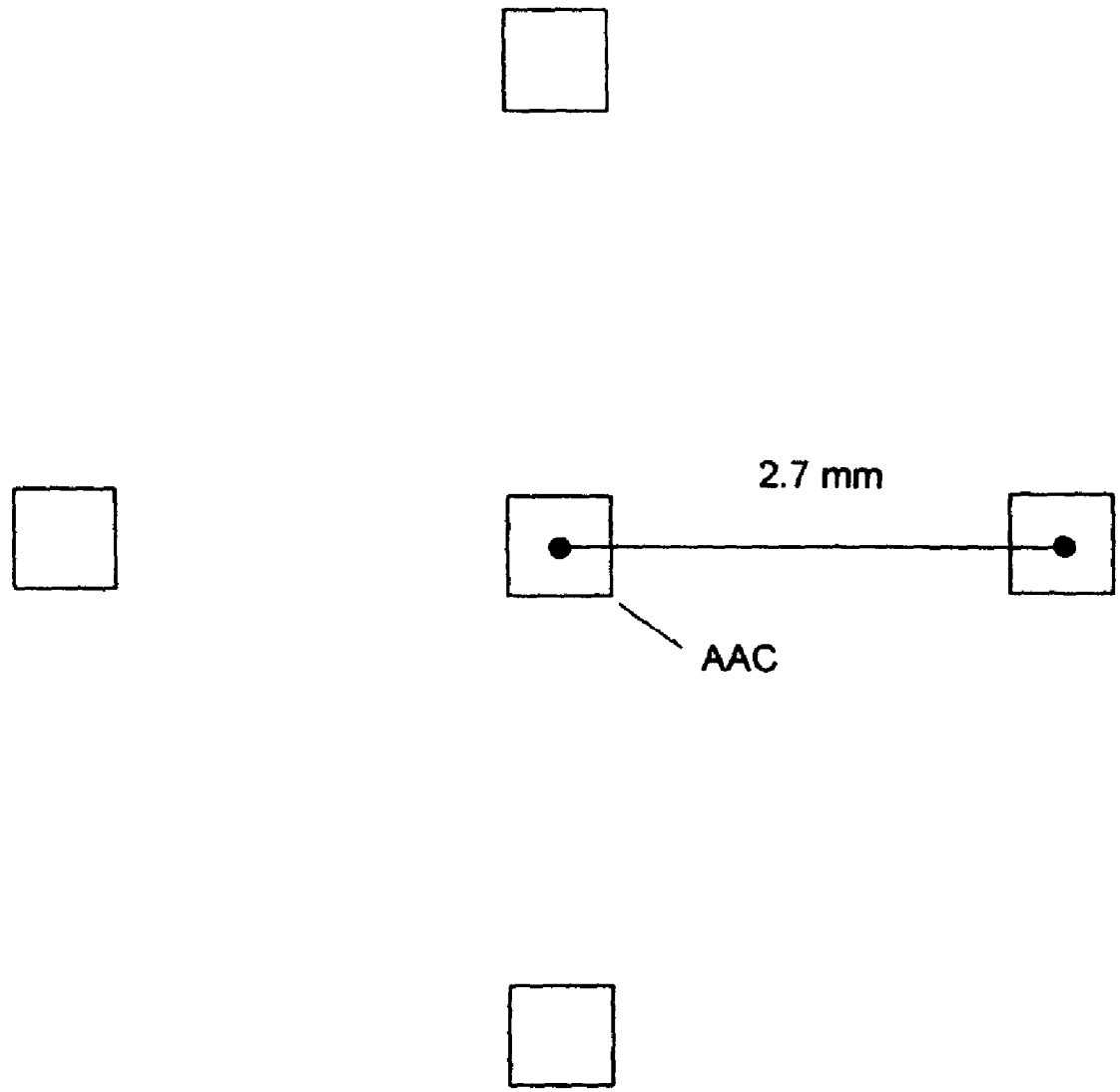
FIG. 10 shows field point or reference array layout.

FIG. 9 shows cross-section of a unit cell or field point of an exit pupil division ZTEL for the first preferred embodiment. It is sized for use on scanners with maximum $NA_x$=0.95, $n_{TEL}$=0.03, M=4. FIG. 10 shows detail of the field point and individual reference array layout.

Having derived the offsets for Exit Pupil Division for the first preferred embodiment we proceed to derive the transverse shifts for Source Division and then perform the calculations for extracting both focus and source telecentricity—possibly, in the presence of other telecentricity and metrology errors.

2$^{nd}$ Embodiment

Source Division

Figure 11:
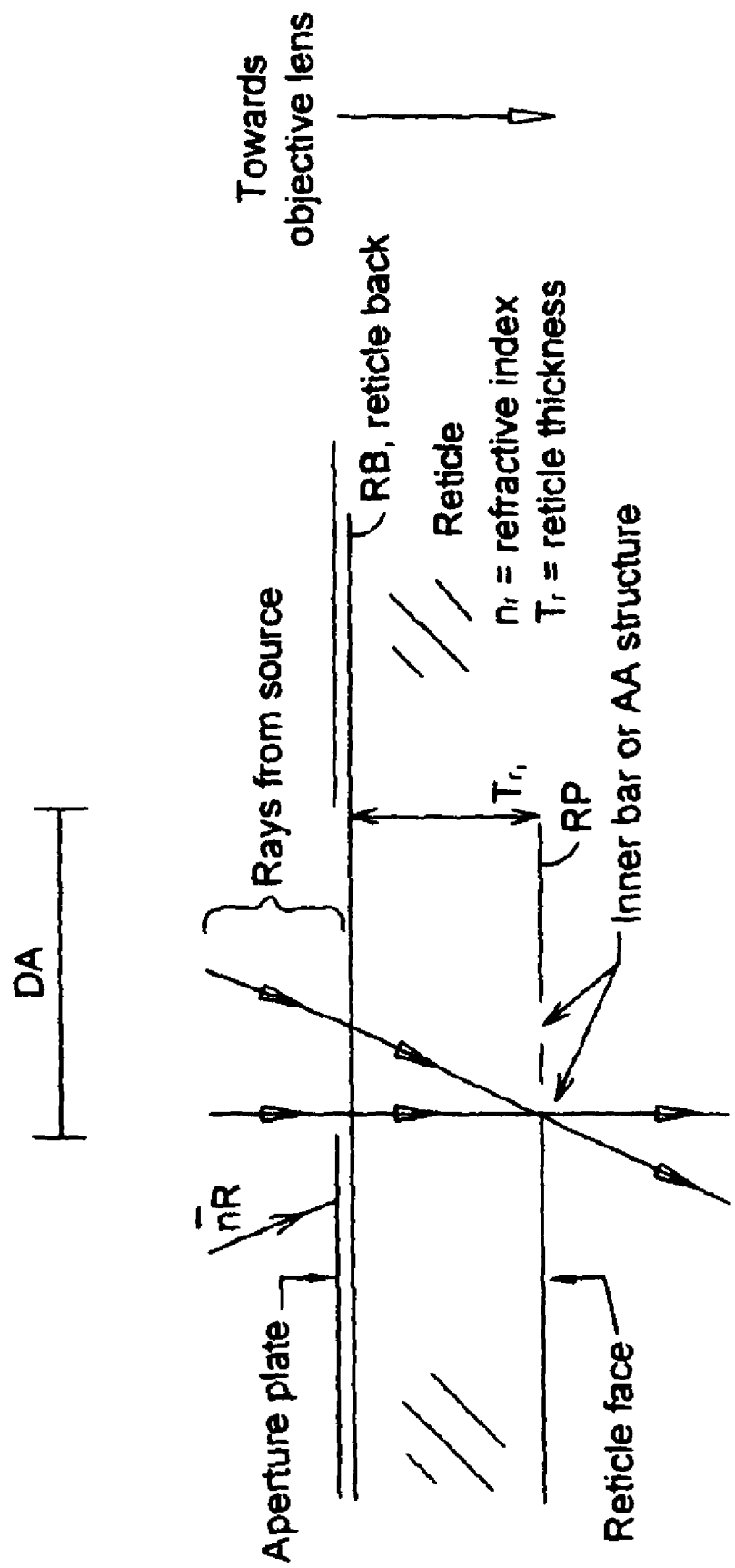
FIG. 11 shows the cross-section of ZTEL, source division arrangement.

FIG. 11 shows a cross-section of an apparatus (ZTEL) for use in determining focus and telecentricity using Source Division as an alternative to Exit Pupil Division (see above). Source truncation by a single straight edge attached to top of reticle is calculated analogously to exit pupil clipping—the results of which produce feature shifts with focus shifts.

Where;
$\overline{n}R$=general source ray on the reticle side
Tr=Reticle thickness For aperture located at $\overline{X}A$ with normal $\overline{n}A$ (nA-subscript), the rays that get past the aperture place and illuminate a point at $\overline{X}R$ on the reticle satisfy (non-occlusion condition):

$$\overline{n}_A \cdot \frac{(\overline{X}_A - \overline{X}_R)}{T_R} > \frac{-\overline{n}_R \cdot \overline{n}_A}{\sqrt{n_r^2 - n_R^2}} \quad \text{Equation 16}$$

Expressing this in terms of a source ray on the wafer side $\bar{n}_s = M(\bar{n}_R - \bar{n}_{TEL})$ we get:

$$\bar{n}_A \cdot \frac{(\bar{X}_A - \bar{X}_R)}{T_R} > \frac{-\bar{n}_A \cdot \left(\frac{\bar{n}_S}{M} + \bar{n}_{TEL}\right)}{\sqrt{n_r^2 - \left(\frac{\bar{n}_S}{M} + \bar{n}_{TEL}\right)^2}} \quad \text{Equation 17}$$

where $n_r$ is the reticle refractive index.

Figure 12:
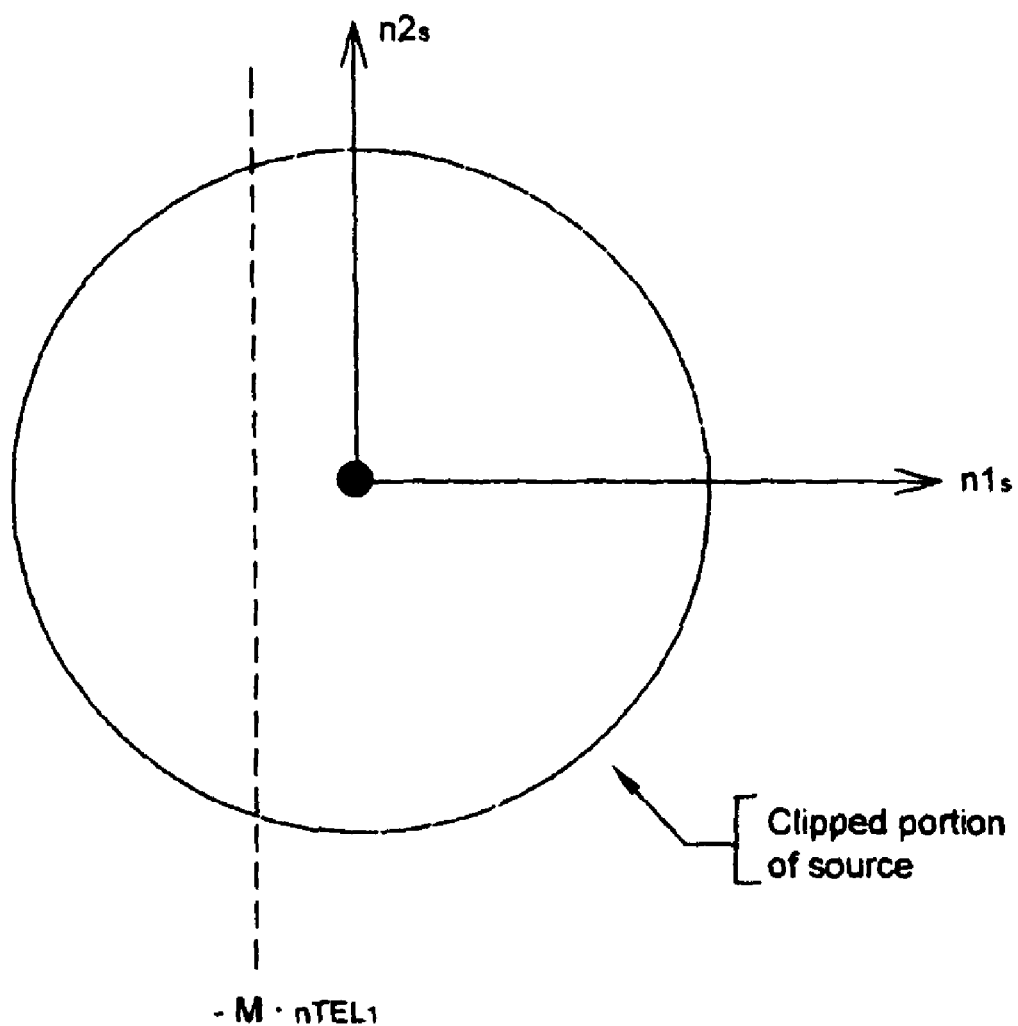
FIG. 12 shows the effect of aperture plate on reticle back side on clipping the effective source.

For a point on the reticle directly above the aperture plate edge and an aperture covering the left half plane, the effect of the aperture plate is to approximately clip off the right half of the source (FIG. 12). The effect of the clipping is to produce a transverse shift sensitivity proportional to z-height or focus.

An approximate formula using geometric optics (i.e., large feature on reticle plane) for the instrumental slope shift, d$\bar{X}$/dZ is given by Equations 7 and 8 but where the effective source, S ($\bar{n}_s$) is given by:

$$S(\bar{n}_S) = \frac{dE}{d0}(\bar{n}_S) \, C(\bar{n}_S) \quad \text{Equation 18}$$

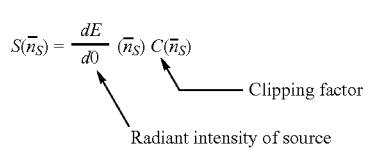

and clipping factor C($n_s$) is given by:

$$C(n_S) = \quad \text{Equation 19}$$
$$\begin{cases} 1 & \text{when non-occlusion condition (Equation 17) is satisfied} \\ 0 & \text{otherwise} \end{cases}$$

A rough estimate of d$\bar{X}$/dZ, same as for exit pupil clipping (Equation 11) is:

$$d\bar{X}/dZ \approx 0.424 \, NA_s \quad \text{Equation 20}$$

The aperture plate opening size is determined by a similar consideration to exit pupil clipping case and leads to formula:

$$DA > 2 \cdot T_r \cdot \tan\left(a\sin\left(\frac{1}{n_r}\left(\frac{NA_X}{M} + n_{TEL}\right)\right)\right) + DAA \quad \text{Equation 21a}$$

Where $n_r$ = index of the glass reticle Table 3 has exemplary DAs.

TABLE 3

Table of Minimum Aperture Hole Sizes for Source Division ZTEL.

| DA [mm] | $NA_X$ = .95 |
|---|---|
| $T_r$ = .15" | 1.47 |
| $T_r$ = .25" | 2.39 |

$n_r$ = 1.51 ($\lambda$ = 248 nm)
$n_{TEL}$ = 0.03 (worst anticipated $n_{TEL}$)
M = 4
DAA = .1

Figure 14:
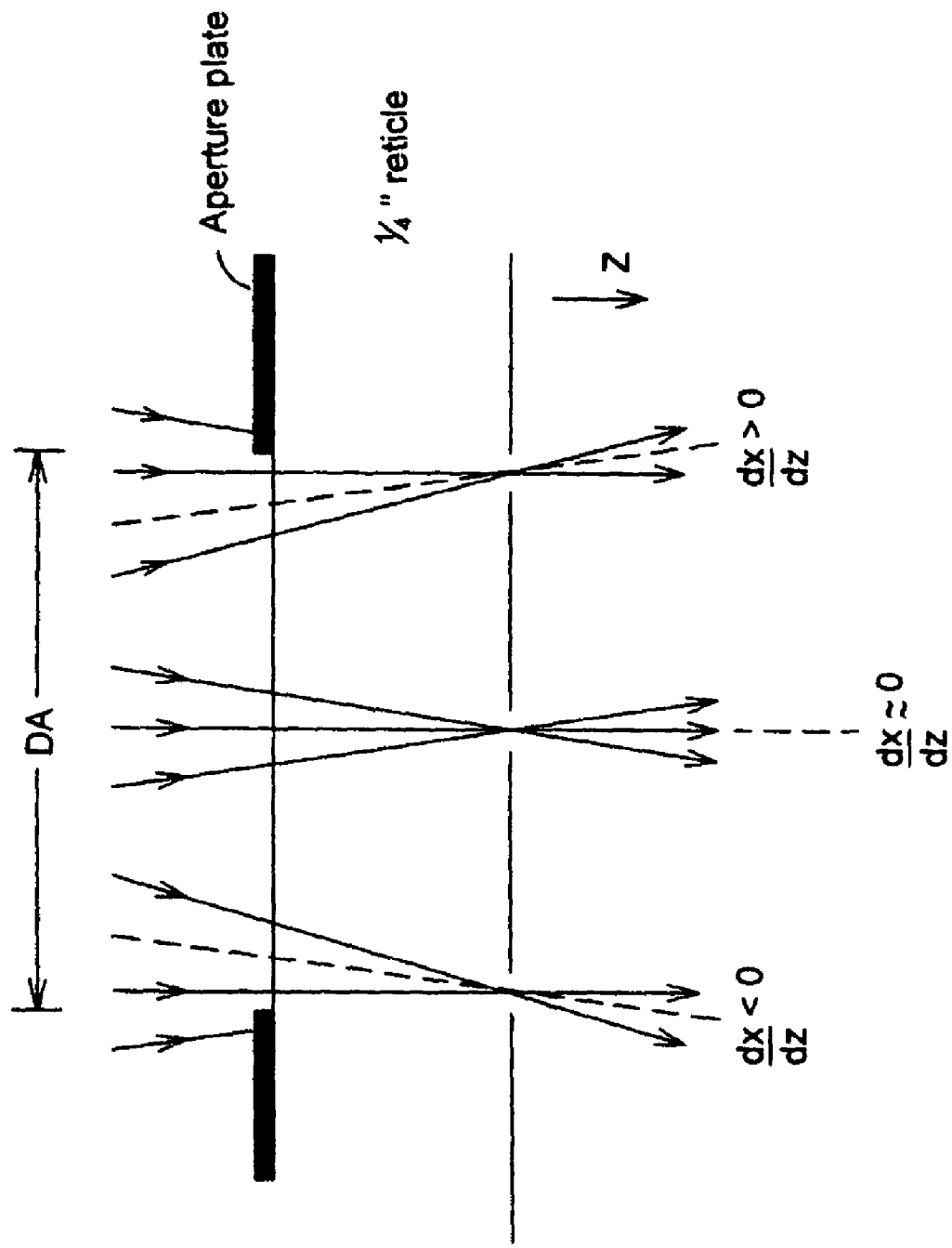
FIG. 14 shows the cross-section of ZF cell.
Figure 15:
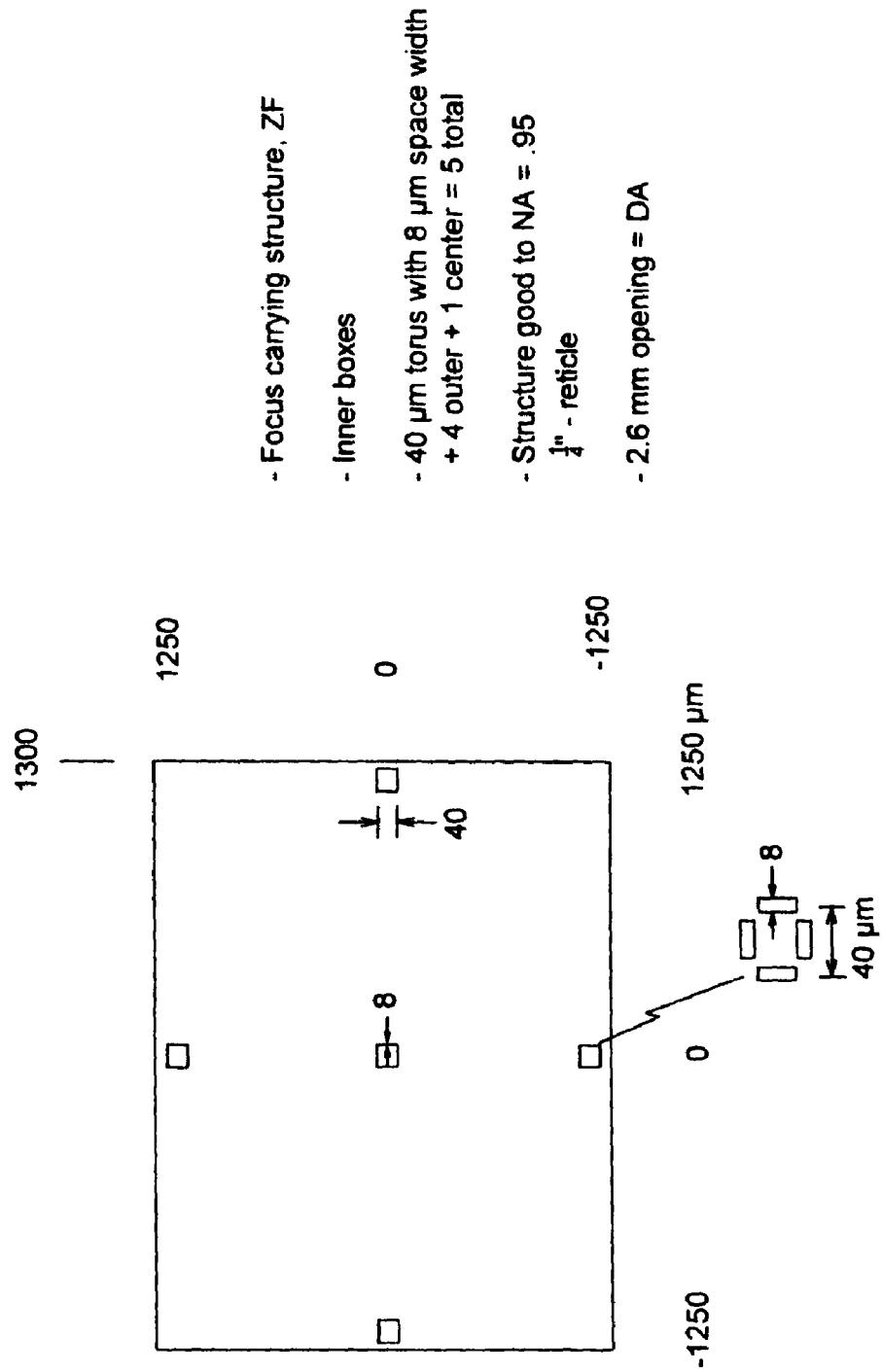
FIG. 15 shows the plan view of ZF cell on source division arrangement.

FIG. 13 shows a reticle plan view for a Source Division ZTEL with square aperture holes. It contains a multiplicity of focus/telecentricity determining unit cells ZF, each of which interacts with its own opening in aperture plate AP to produce an instrumental slope shift d$\bar{X}$/dZ. Reference box structures, ZR consist of un-occluded (by AP) alignment attributes complementary to those in each ZF. Extra dose structures ZED are used to expose clipped alignment attributes so we can compensate for their reduced gain (infra) and thereby utilize this device in scanners running at production settings. FIGS. 14 and 15 show cross-sectional and plan views of ZF cells for an exemplary design that works out to an $NA_x$=0.95. Reference array ZR is as in FIG. 10 only now separation from central alignment attribute AAC is 1.25 mm instead of the 2.4 mm shown for exit pupil division arrangement. Each square is an 80 μm square annulus with 8 μm thick bars (spaces). Extra dose structures, ZED, are shown in plan view in FIG. 16. They consist of large (~400 μm) open squares on the reticle that can be centered on the clipped AA of FIG. 15 by shifting the wafer for a separate exposure at dose<E0 (E0=minimal clearing dose for a large feature).

The gain G (<1) caused by the aperture plate on the clipped features can be written as:

$$G = \int \frac{d^2 n_r}{\sqrt{1 - n_W^2}} \frac{dE}{d0}(\bar{n}_W) \textcircled{H} \quad \text{Equation 21b}$$

$$\left[ \frac{\bar{n}_r \cdot \bar{n}_e}{\sqrt{n_{re}^2 - n_r^2}} < (\bar{X}_r - \bar{X}_e) \cdot \bar{n}_e / T_{re} \right]$$

$$\frac{\int d^2 n_r \frac{dE}{d0}(\bar{n}_W)}{\sqrt{1 - n_W^2}}$$

which after some manipulation can be re-expressed as:

Equation 22

$$G = \frac{\int dv \int^{\sqrt{\frac{n_{re}^2 - v^2}{1+a^2}}} du \frac{dE}{d0}\left[(u\bar{n}_e + v\bar{n}_{ep} - \bar{n}\bar{x}_{TEL})\frac{M}{n_i}\right]}{\sqrt{1 - \left(\frac{M}{n_i}\right)^2 (u\bar{n}_e + v\bar{n}_{ep} - \bar{n}\bar{x}_{TEL})^2}}$$
$$\frac{\int du dv \frac{dE}{d0}\left[\frac{M}{n_i}(u\bar{n}_e + v\bar{n}_{ep} - \bar{n}\bar{x}_{TEL})\right]}{\sqrt{1 - \left(\frac{M}{n_i}\right)^2 (u\bar{n}_e + v\bar{n}_{ep} - \bar{n}\bar{x}_{TEL})^2}}$$

where:
u,v=integration variables over the aperture
$\bar{X}_r$=AA position on reticle
$\bar{X}_e$=aperture plate edge position
$\bar{n}_e$=aperture plate normal pointing into occluded region at $\bar{X}_e$
$\bar{n}_{ep}$=(−ney, nex)=unit vector perpendicular to $\bar{n}_e$
$n_w$=direction cosine at the wafer
$\bar{nx}_{TEL}$=entrance pupil telecentricity
M, $n_i$=scanner reduction magnification, wafer side immersion index $$\frac{dE}{d0}(\bar{n}w) = \text{illumination source as projected through scanner onto wafer side}$$

$T_{re}=T_r/n_r=$reticle thickness/reticle refractive index and $$a=(\bar{X}_r-\bar{X}_e)\cdot\bar{n}_e/T_{re} \quad \text{Equation 23}$$

Numerical evaluation of Equation 22 produces values in the range G=0.4-0.6 so that with a typical product level dose:

$$E=n\cdot E0 \text{ (E0 is clearing dose)} \quad \text{Equation 24}$$

Where n~2:4 range the dose at the wafer for clipped alignment attributes is:

$$\frac{ECAA}{E\Phi} = \quad \text{Equation 25}$$

$G\cdot n \sim 0.8 - 2.4$ where $ECAA$ is energy for clearing $AA$ and is therefore not always (ECAA/E0<1) capable of properly exposing clipped AAs. The purpose of ZED is to blanket expose a large (~100 μm at wafer) region around each clipped AA so that total dose/E0 is≧1. From Equation 25 we see that setting the ZED exposure dose EZED to:

$$EZED/E0{\sim}0.5 \quad \text{Equation 26}$$

will not wash out bar structures of clipped ZF and will allow under exposed bars to develop out. FIG. 17 illustrates the exposure sequence (process flow) for the ZTEL. It applies to both source and exit pupil division embodiments.

Calculation

Boresighting Error and Focus for the 1$^{st}$ and 2$^{nd}$ Embodiments:

FIG. 18 shows three completed alignment attributes (AAL', AAC', AAR') after ZF, ZREF and possibly ZED exposures. To illustrate extraction of boresighting error we first discuss the case of zero entrance ($n_{TEL}=0$) and exit pupil telecentricity. When alignment attributes AAL, AAC, AAR are large spaces or lines $$\left(SW \gg \frac{\lambda}{2NA_X}\right).$$

Figure 19A:
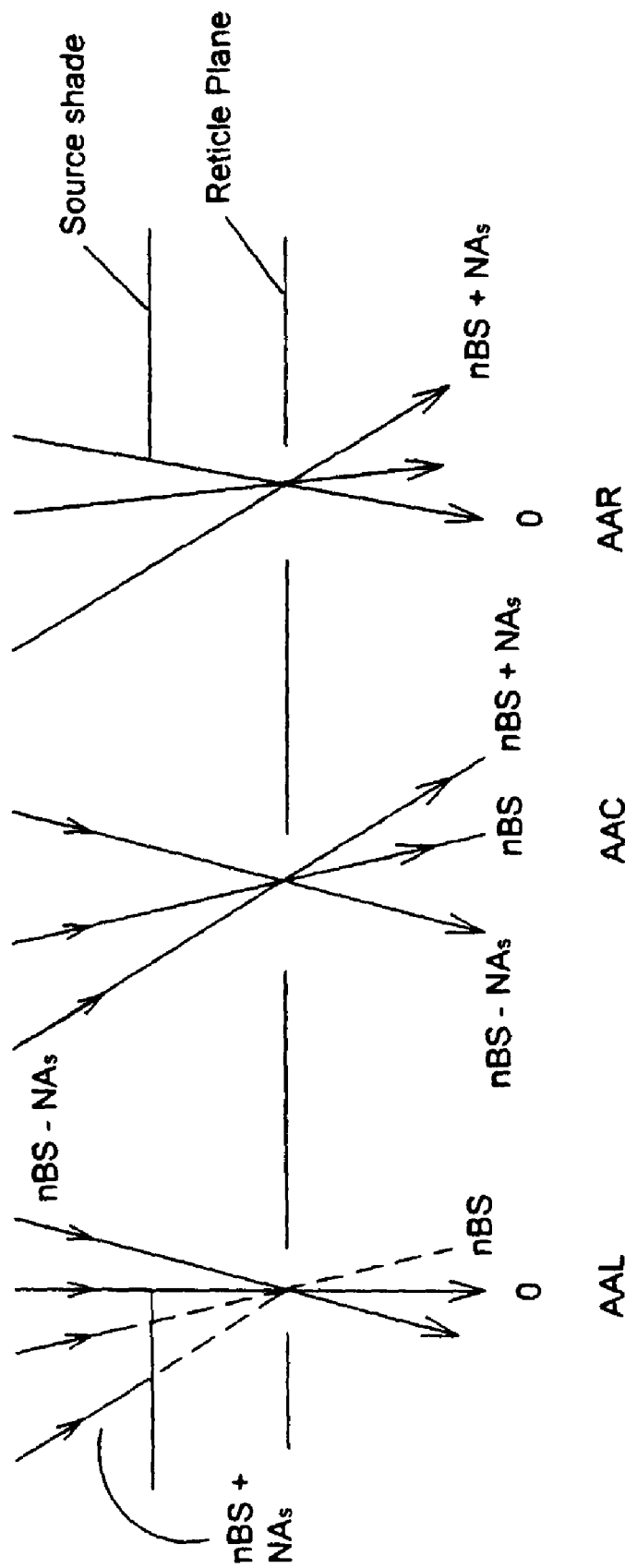
FIG. 19a shows illumination geometry for source division arrangement extraction of telecentricity.
Figure 19B:

For a 1-d source with:
nBS=reticle side boresighting error>0
$NA_s$=source NA on reticle side The directional centroid, <nx>is given approximately by:

$$\langle nx \rangle = \int dnx \, nx \, I(nx)/\int dnx \, I(nx) \quad \text{Equation 27}$$

with the value of <nx> for AAL, AAC, AAR shown in FIG. 19b. Now, $$\frac{dx}{dZ} \sim \langle nxI \rangle = \text{effective source centroid at wafer in immersion medium} \quad \text{Equation 28}$$

$$= M \cdot \langle nx \rangle / nI, \, nI$$

$$= \text{immersion medium index}$$

AAL, AAC, AAR features are printed as inner boxes at focus position F1 while the outer boxes are printed without the source shade present and at a possibly different focus, F2, and shifted (possibly) by $T_x$. $T_x$ shift is due to stage positioning errors. Using Equation 28 and the results in FIG. 19b, the x-shifts are calculated in Table 4 below:

TABLE 4

| | X-shifts | |
|---|---|---|
| Site | Inner Box | Outer Box |
| L | $\frac{M}{2\,nI}(nBS - NA_S)F1$ | $\frac{M}{nI}\cdot nBS\cdot F2 + T_X$ |
| C | $\frac{M}{nI}nBS\cdot F1$ | $\frac{M}{nI}\cdot nBS\cdot F2 + T_X$ |
| R | $\frac{M}{2\,nI}(nBS + NA_S)\cdot F1$ | $\frac{M}{nI}\cdot nBS\cdot F2 + T_X$ |

The total measured bar-in-bar shift (BB) is just:

$$BB=\text{outer box position}-\text{inner box position} \quad \text{Equation 29}$$

We can extract F1 by looking at:

$$BBL - BBR = \frac{M\cdot NA_S}{nI}\cdot F1 \quad \text{Equation 30}$$

since M, nI, $NA_S$ are otherwise known, we get the focus value F1:

$$F1 = \frac{nI}{M\cdot NA_S}(BBL - BBR) \quad \text{Equation 31}$$

We can extract nBS, the source boresighting or telecentricity error, by looking at:

$$BBR + BBL - 2BBC = -\frac{M\cdot nBS}{nI}F1 \quad \text{Equation 32}$$

so that:

$$nBS = \frac{nI}{M\cdot F1}[2\cdot BBC - BBR - BBL] \quad \text{Equation 33}$$

For this embodiment, we are especially sensitive to nBS when running out of focus (i.e., F1~1 μm). So, if we are particularly interested in nBS, because these exposures are carried out with large features, we can run significantly (F1/1 μm) out of focus to increase our sensitivity to nBS.

The above discussion applies to both source and exit pupil division arrangements. FIG. 20 illustrates the relation of entrance pupil/exit pupil and source centroids. In the presence of wafer reticle side telecentricity (nxi, $n_{TEL}\neq 0$) the x-shifts of Table 4 become:

TABLE 5

X-shifts for Large Features.

| Site | ΔX (inner box) | ΔX (outer box) |
|------|---------------|----------------|
| L | $F1\left[nxi + \frac{M}{2\,nI}(nBS - n_{TEL} - NA_S)\right]$ | $F2\left[nxi + \frac{M}{nI}n_{TEL}\right] + T_X$ |
| C | $F1\left[nxi + \frac{M}{nI}(n_{TEL} + nBS)\right]$ | $F2\left[nxi + \frac{M}{nI}n_{TEL}\right] + T_X$ |
| R | $F1\left[nxi + \frac{M}{2\,nI}(nBS - n_{TEL} + NA_S)\right]$ | $F2\left[nxi + \frac{M}{nI}n_{TEL}\right] + T_X$ |

As before, we can get F1:

$$F1 = \frac{nI}{M \cdot NA_S}(BBL - BBR) \quad \text{Equation 34}$$

while only the combination $nBS + 3 \cdot n_{TEL}$ we can extract from $$nBS + 3 \cdot n_{TEL} = \frac{-nI}{F1 \cdot M}(BBR + BBL - 2BBC) \quad \text{Equation 35}$$

3$^{rd}$ and 4$^{th}$ Embodiments

Source or Exit Pupil Division Using Additional Grating Patterns

If we utilize an exit pupil division arrangement with alignment attributes AAL, AAC, AAR comprising diffractive gratings $$\left(\frac{\lambda}{GP} \sim NA_e = \text{entrance pupil numerical aperture}\right)$$

such as those in U.S. Pat. No. 6,079,256 or small $$\left(SW \sim \frac{\lambda}{2NA_e}\right)$$

features then diffraction by our alignment attributes will fill up the entrance pupil and effectively wash out or minimize the effects of source structure (boresighting error and size). Reference marks, ZR, are also exposed using small features so that we get for shifts the results of Table 6:

TABLE 6

X-shifts for 'Small' ZF Structures (Exit Pupil Division) and 'Large' ZR Structures.

| Site | ΔX (inner box) | ΔX (outer box) |
|------|---------------|----------------|
| L | $F1\left[nxi + \frac{M}{nI} \cdot \frac{NA_e}{2}\right]$ | $F2 \cdot nxi + T_X$ |
| C | $F1 \cdot nxi$ | $F2 \cdot nxi + T_X$ |
| R | $F1\left[nxi - \frac{M}{nI} \cdot \frac{NA_e}{2}\right]$ | $F2 \cdot nxi + T_X$ |

Figure 21:
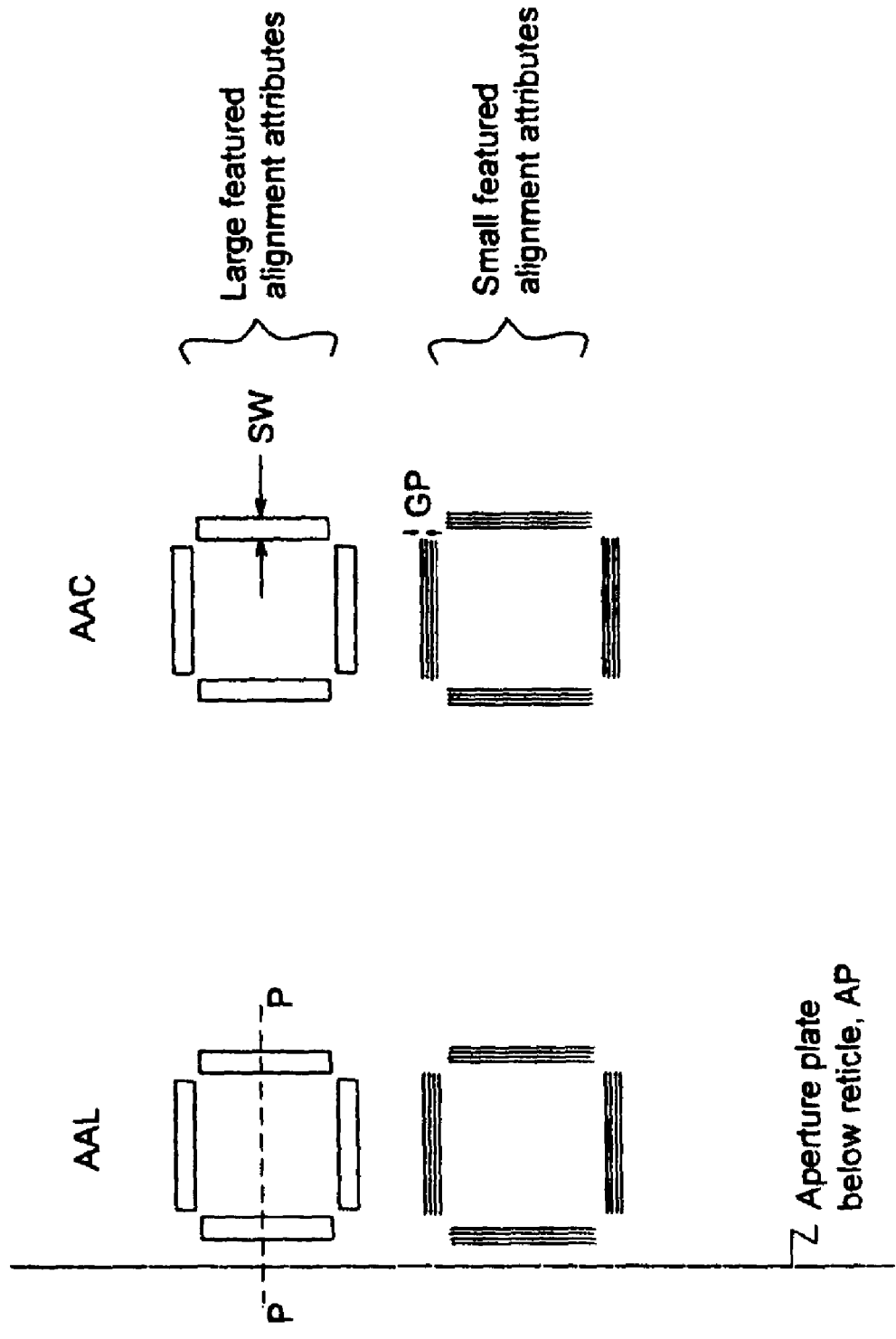
FIG. 21 shows combined large and small featured alignment attributes as ZF structure in exit pupil division arrangement; only left (AAL) and center alignment attributes are shown.

Now by simultaneously combining small and large features into ZF structures (FIG. 21) we can simultaneously print them at a single focus (F1) value. Reference structures ZR will be the alignment attributes complementary to AAL and AAC shown in FIG. 21 but will be completely unoccluded by aperture plate AP. From inspection of Tables 5 and 6, we easily see that:

$$BBC_{large} - BBC_{small} = F1 \cdot \frac{M}{nI}(n_{TEL} + n_{BS}) \quad \text{Equation 36}$$

$$BBR_{large} + BBL_{large} - 2BBC_{small} = \frac{F1 \cdot M}{nI}(n_{BS} - n_{TEL}) \quad \text{Equation 37}$$

where:

$BBC_{small/large}$=BB measurement from small/large featured central alignment attribute (AAC)

$BBR/BBL_{large}$=BB measurement from right/left large featured alignment attribute (AAR/AAL). Since F1 is known from Equation 31 or 34, we independently get nBS and $n_{TEL}$.

Fifth and Sixth Embodiments

Extracting Exit Pupil Telecentricity Using Source or Exit Division

Further measurements will allow us to get exit pupil telecentricity nxi. For example, if we expose the ZF structures at a relatively large F1~+1 μm and use as a reference a separate reticle with an array of ZR structures (no aperture plate present on second reticle) spatially co-incident with each ZF structure, and exposed at a second purposefully shifted focus position F2~−1 μm, then by looking at $BBC_{small}$ or $BBC_{large}$, we will be able to extract nxi over the projected field of ZFs to within a few transverse spatial modes dependent only on the exposure mode used. Thus for determining nxi over a static field (stepper or scanner) it will be determined as a function of field position (x,y) to within a net translation and rotation viz:

$$\overline{nxi}(x,y) = \overline{nxi}(x,y)|_{known} + (a - b \cdot x, c + b \cdot Y) \quad \text{Equation 38}$$

where a, b, c are unknown constants.

Detailed Consideration of Feature Shifts

Figure 22:
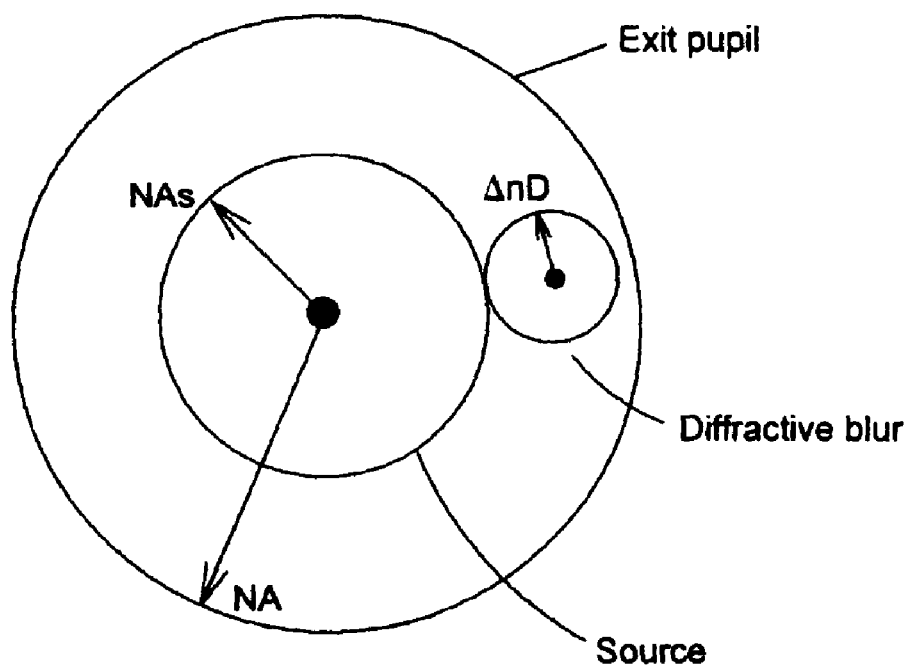
FIG. 22 is an illustration of combination of source size (NAs) and feature diffractive blur ($\Delta$nD)

Hitherto we have used relatively simple models for calculating instrumental slope shifts (dx/dZ). To the extent that we are imaging large features at the reticle, the feature will shift spatially as a function of z-height (focus), linearly along the direction of the source telecentricity. By large feature, we mean a feature that has a relatively small diffractive radius, $\Delta n_D$, so that the angular size of the source and the diffractive spreading fits within the exit pupil (FIG. 22), the following relation obtains:

$$NA_S + 2\Delta n_D \square NA \quad \text{Equation 39}$$

Figure 23:
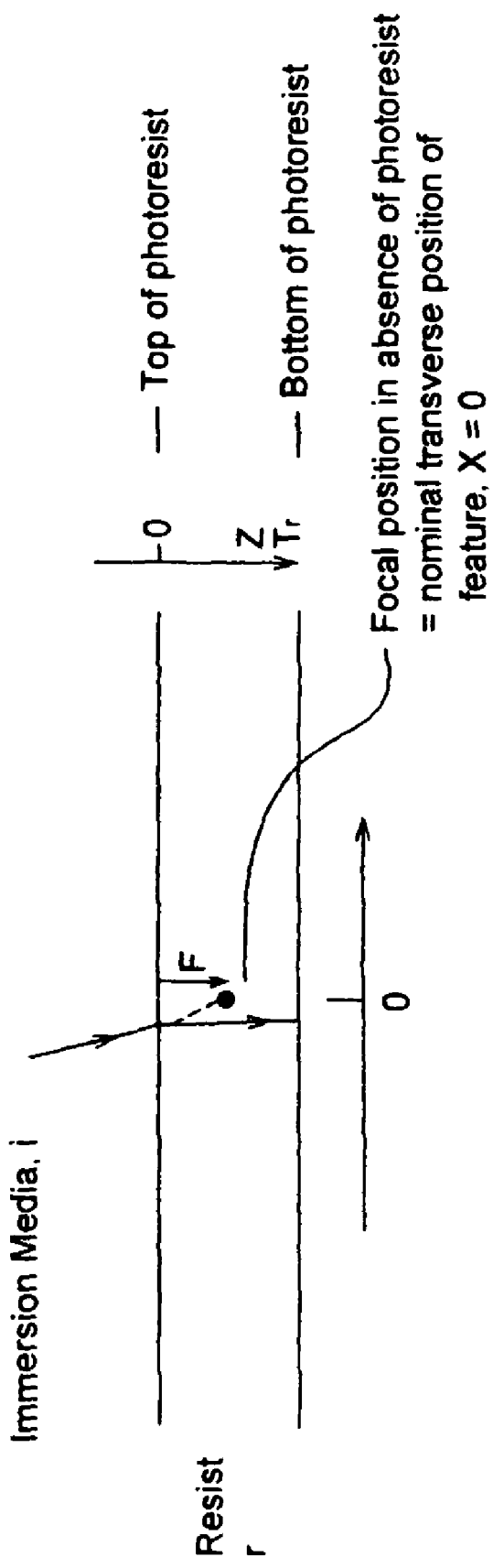
FIG. 23 shows the geometry and rotation for shift calculation in the presence of photoresist.

Now even in the relatively simple situation we have neglected the finite photoresist thickness ($T_r$) and refractive index ($n_r$) that will differ from our immersion media (FIG. 23). In FIG. 23:

F=focal value of incident light

F<0→the focus or ray convergence occurs a distance |F| above the resist (Z=F); transverse position where rays converge is X=0

F=0→rays converge at resist top (Z=0) at X=0

F>0→rays converge F below resist top at Z=F, X=0.

Then the image shift while propagating through the resist is given by:

$$\overline{XC}(Z) = \text{transverse centroid of ray bundle at } Z \text{ from resist top} = Z\frac{d\overline{x}}{dZ}\bigg|_r - F\frac{d\overline{x}}{dZ}\bigg|_i \quad \text{Equation 40}$$

where we must separately calculate instrument slopes in resist $$\left(\frac{dx}{dZ}\bigg|_r\right)$$

and immersion media $$\left(\frac{dx}{dZ}\bigg|_i\right).$$

Again, we can derive formulas utilizing simple geometric ideas. Thus for a reticle side source telecentricity ($\overline{ns}_{TEL}$) and telecentric entrance pupil ($\overline{n}_{TEL}=0$) for an un-occluded alignment attribute we would have:

$$\frac{d\overline{x}}{dZ}\bigg|_i = \frac{M}{n_i}\overline{ns}_{TEL} \bigg/ \sqrt{1-\left(\frac{M}{n_i}\right)^2 \overline{ns}_{TEL}^2} \quad \text{Equation 41}$$

The above formula is in the immersion medium (i). Once in the photoresist, the shift changes to:

$$\frac{d\overline{x}}{dZ}\bigg|_r = \frac{M}{n_r}\overline{ns}_{TEL} \bigg/ \sqrt{1-\left(\frac{M}{n_r}\right)^2 ns_{TEL}^2} \quad \text{Equation 42}$$

We can also derive the more general formulas in presence of general non-telecentricity and boresighting errors and compare them with simulations (see above discussion for example).

Figure 24:
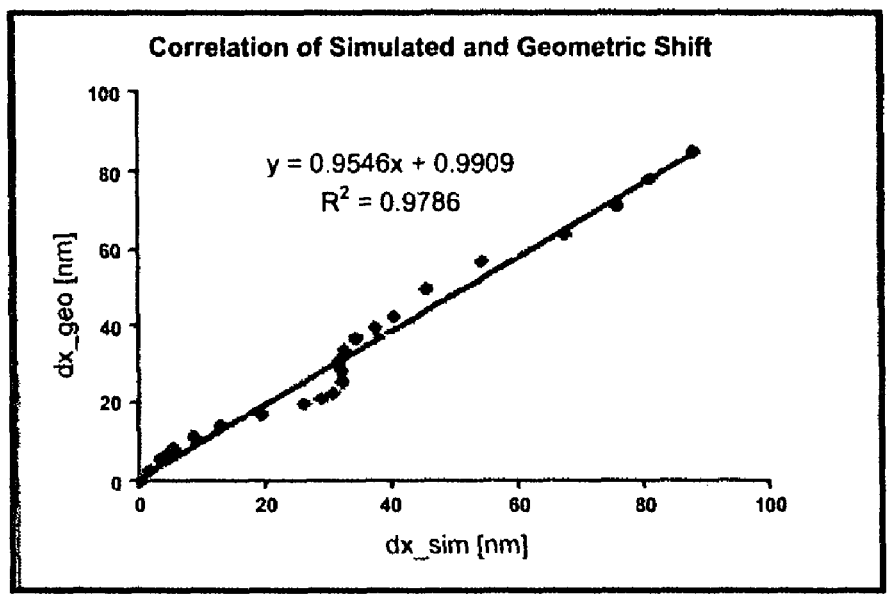
FIG. 24 shows simulation conditions and correlations.
Figure 26:
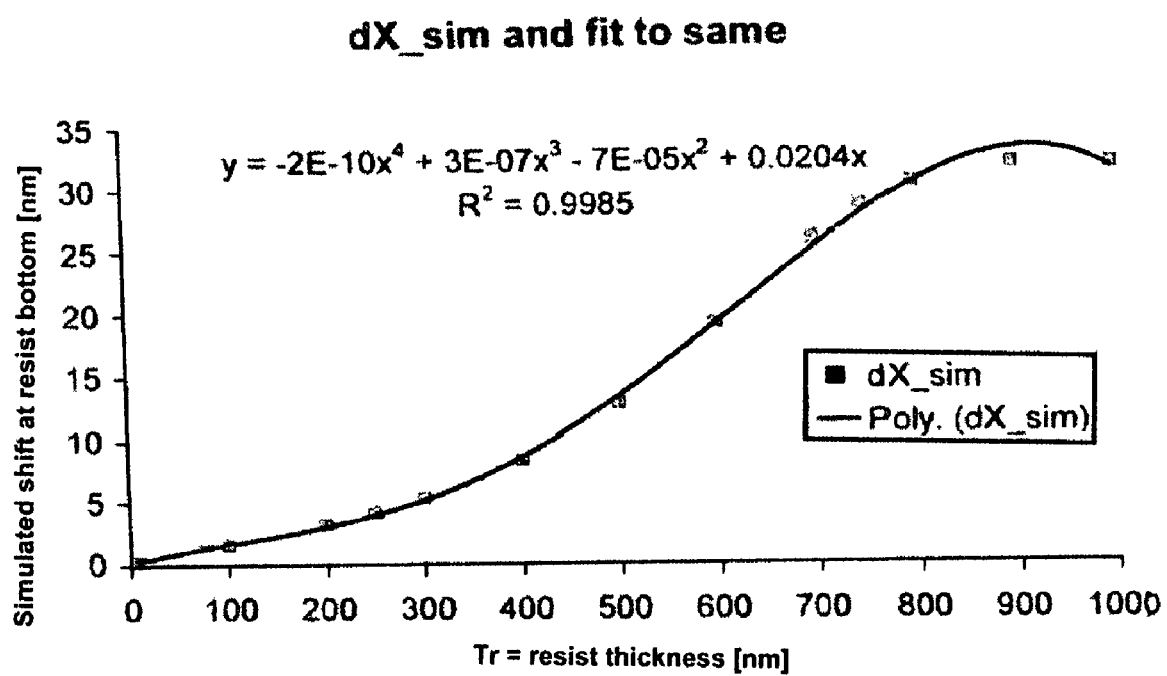
FIG. 26 shows the fit of simulated shift dx_sim to resist thickness $T_r$.
Figure 27:
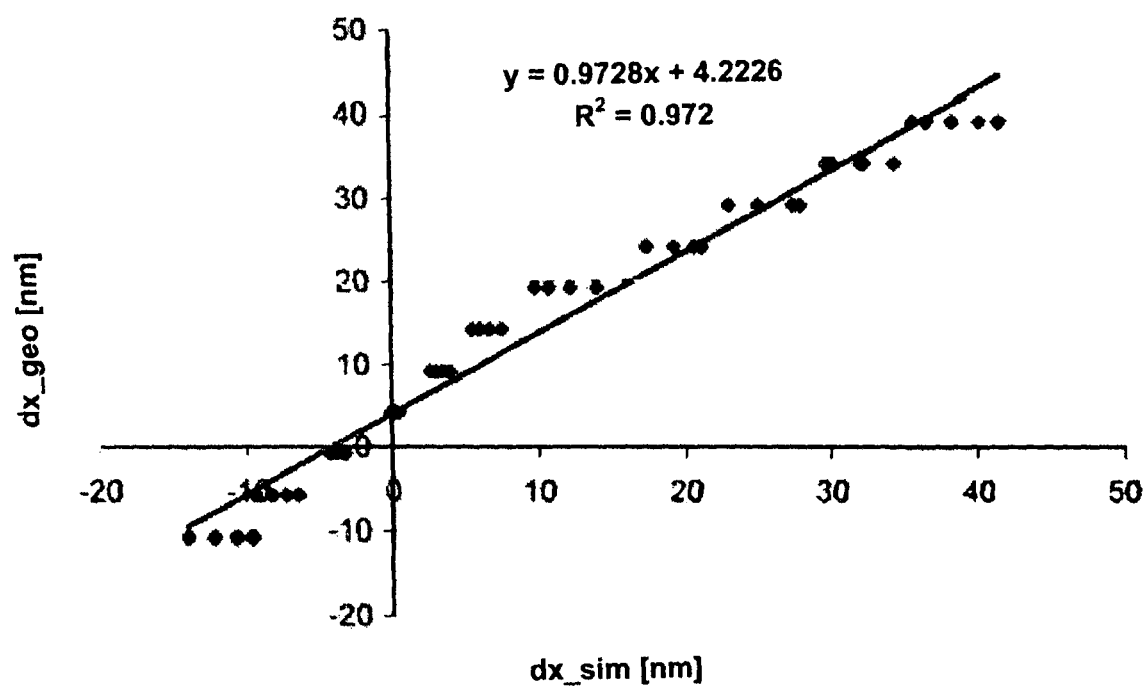
FIG. 27 shows correlations of further simulation results with a geometric model.

Comparison with Resist Simulations:

FIG. 24 shows a comparison of a set of simulations of feature shift at resist bottom with geometric calculation. Overall correlation is good, however, there are some relatively large (~7.5 nm or ~30%) differences for resist thickness in 700-800 nm thickness range. FIG. 25 shows typical simulation output for a single simulation. A fourth order polynomial in $T_r$ (FIG. 26) is required for reasonable fit, not the linear fit indicated by Equation 40. FIG. 27 shows correlations of simulations over a wider range of focus and dose values. There are up to 10 nm deviations from the simple geometric model. FIG. 28 shows variation of shift with resist thickness. Up to 16 nm deviations from linear model and a cubic polynomial is required to fit shift to resist thickness variation.

Figure 29:
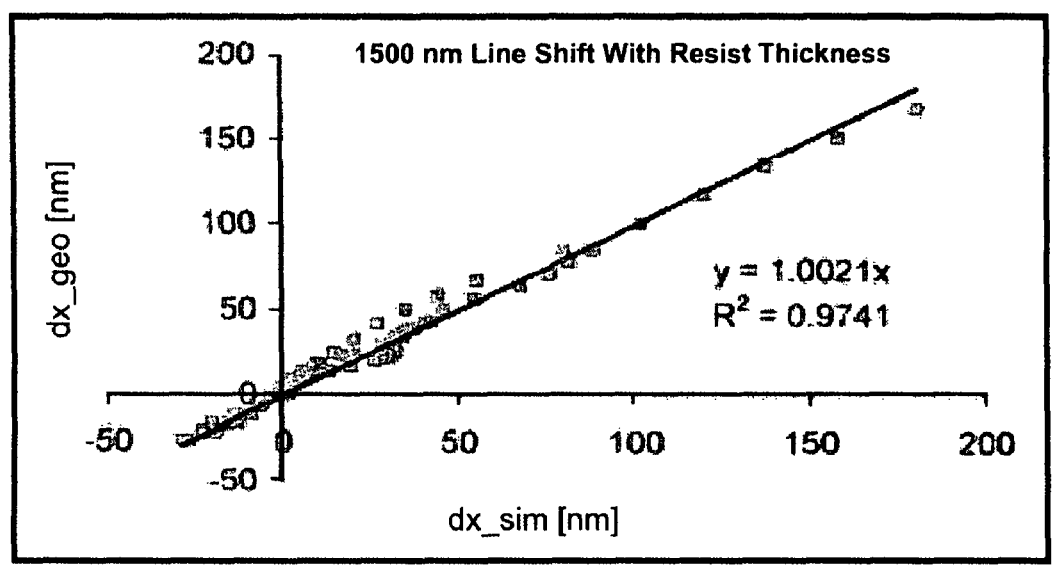
FIG. 29 shows correlation of simulated and geometric calculation of resist shift, multiple cases.

Further simulations with the same conditions as in FIG. 28 but with a threshold model in air show deviations from the geometric model up to 8 nm. Still further simulations using a threshold resist model show>10 nm deviations from geometric model are present. FIG. 29 correlates all of the geometric and simulated shift data. High general correlation is good but for point by point use in metrology, less deviation is required than shown. One of the conclusions from simulations is we cannot rely on the simple geometric model of Equations 40, 41 and 42 to account for feature shift. Instead we need to use fits to simulation results.

Seventh and Eighth Embodiments

Source Boresighting and Focus in the Presence of Aberrations

Figure 30:
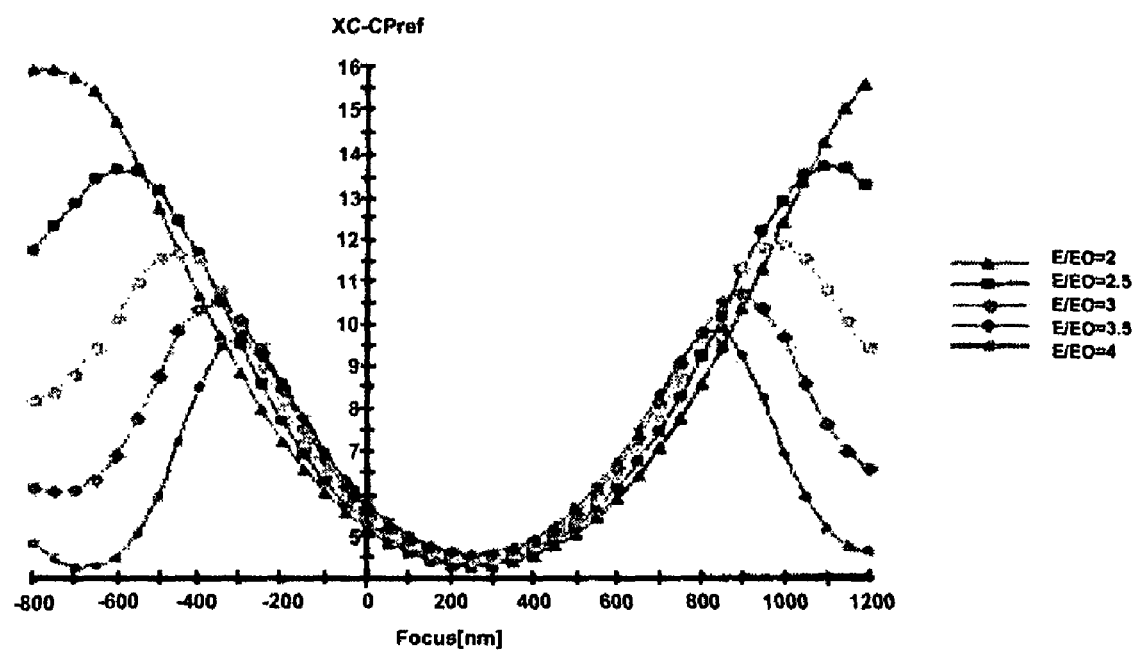
FIG. 30 shows simulation conditions and results of coma induced feature shift.

All of the above utilized zero wavefront aberrations. In the presence of non-zero wavefront aberrations, there will generally be a non-linear response (in F) of the shift caused by focus. FIG. 30 shows simulation conditions and results of coma induced feature shift. In the region centered around F=200 nm the shift is relatively independent of dose (E/E0) and can be written as:

$$\Delta X_{coma}(F) = a8 \cdot \frac{dx}{da8}(F) \quad \text{Equation 43}$$

where:

a8=X-coma aberration (radians)

and dx/da8 is approximately given by:

$$\frac{dx}{da8} \sim 0.000267 \cdot (z - 256.9)^2 + 85.5 \text{ nm/rad} \quad \text{Equation 44}$$

Figure 31:
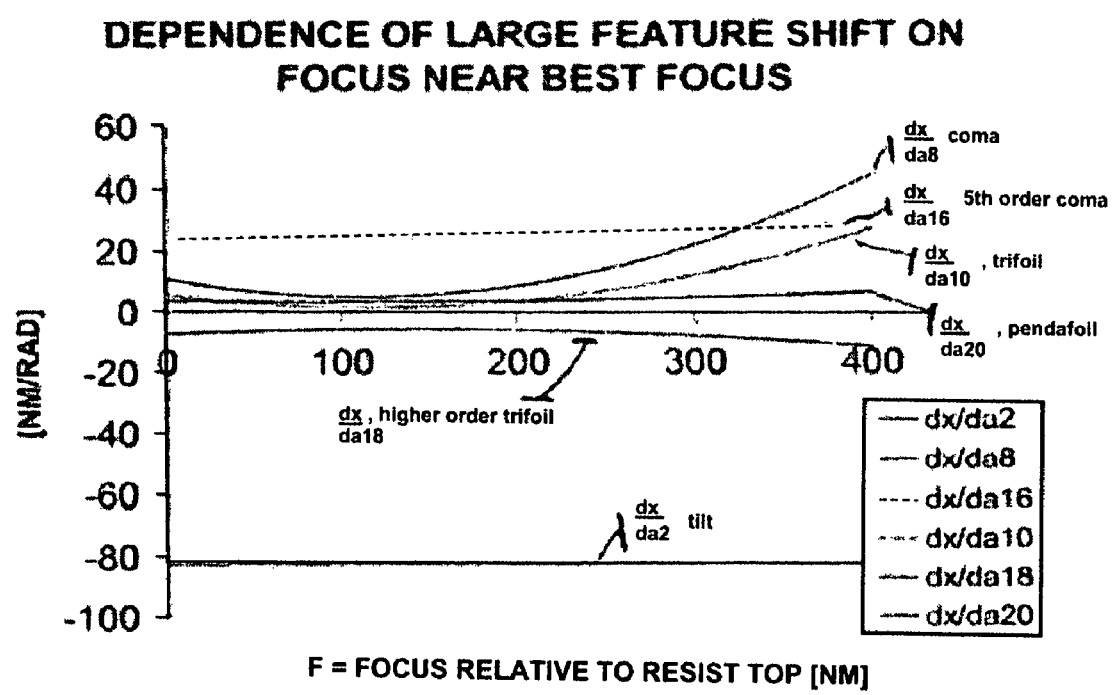
FIG. 31 shows some aberration dependant feature shifts as a function of focus, F.

FIG. 31 shows the results of multiple sets of simulations of this type. The conclusion from these considerations is that we typically need to know the aberrations ($a_i$) as preferably determined by some in-situ method (see U.S. Pat. No. 5,828,455) and include a term of the form:

$$\Delta X_{abb}(F) = \sum_{i=1}^{n} a_i \frac{dx}{da_i}(F) \quad \text{Equation 45}$$

on the right hand side of our BB equations (Equations 30 and 32) when solving for F. The above simulations were for large features. Small features will have their own, unique $$\frac{dx}{da_i}(F)$$

functions which need to be separately simulated.

Illumination source $$\left(\frac{dE}{d0}\right)$$

deviation from ideal as determined for instance by U.S. Pat. Nos. 6,356,345 B1 or 6,741,338 B2 will also modify $$\frac{dx}{dZ}$$

and need to be taken into account.

$9^{th}$ and $10^{th}$ Embodiments

Amelioration of Metrology Induced Error

Metrology Effects, Theory:

While aberration and source imperfections complicate our determination of focus and telecentricity, there exist good in-situ methods for measuring them and subsequent simulations allow us to remove their effects. Simulations (supra) utilize the bottom position of a line or space as designating the shift. In practice, because of the relatively large slopes introduced by the focusing fiducials (ZF), the resist will not have perpendicular or nearly perpendicular sidewalls. For a resist line we have (FIG. 32a):

Left edge:

$$XL(Z) = XL(T_r) - (T_r - Z)\tan(QL - \pi/2) \quad \text{Equation 2.100}$$

Right edge:

$$XR(Z) = XR(T_r) - (T_r - Z)\tan(QR - \pi/2) \quad \text{Equation 2.101}$$

while for a space in resist we have (FIG. 32b):

Left edge:

$$XL(Z) = XL(T_r) + (T_r - Z)\cdot\tan(QL - \pi/2) \quad \text{Equation 2.102}$$

Right edge:

$$XR(Z) = XR(T_r) - (T_r - Z)\cdot\tan(QR - \pi/2) \quad \text{Equation 2.103}$$

The repeated position by an overlay tool will be a combination of Z weighted edge positions. The weighting factor will generally depend on whether the resist is overhanging (left edge of FIG. 32a) or not overhanging (right edge of FIG. 32a). Wall angle QL or QR (supra) determines whether slope is overhanging or normal according to:

Q>p/2 overhanging

Q=0 vertical  Equation 2.104

Q<p/2 normal

The edge weighting function will be a slight function of Q.

WE(Z,Q) = edge weighting function for resist at depth Z and wall slope Q  Equation 2.105 normalized as:

$$\int_0^{T_r} \frac{dz}{T_r} WE(Z, Q) = 1 \quad \text{Equation 2.106}$$

Figure 32A:
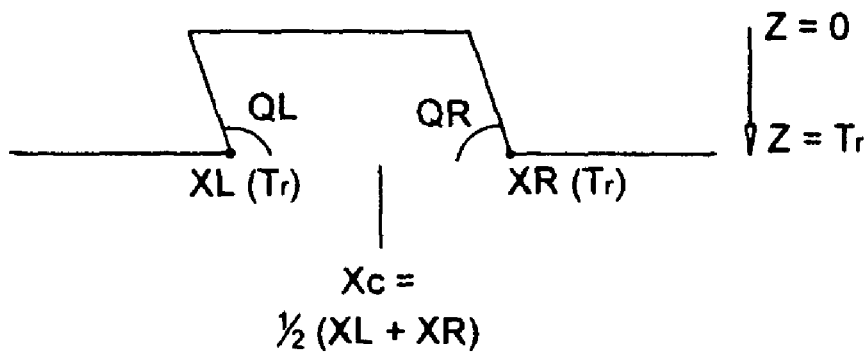
FIG. 32a shows resist line notation/geometry.

Thus, the left edge of the line in FIG. 32a would have measured edge location:

$$XL_M = \langle XL(Z) \rangle \quad \text{Equation 2.107}$$

$$= \int_0^{T_r} \frac{dz}{T_r} WE(Z, QL) XL(Z)$$

$$= XL(T_r) - fh(QL)\cdot T_r \cdot \tan(QL - \pi/2)$$

where we have used the normalization condition of Equation 2.106 and introduced the fractional height, fh:

$$fh(Q) = \int_0^{T_r} \frac{dz}{T_r}\left(1 - \frac{z}{T_r}\right) WE(Z, Q) \quad \text{Equation 2.108}$$

Applying this to the other edges above we get Table 2.100.

TABLE 2.100

Measured Edge Locations with Metrology Model.

| Feature | Edge | Measured Edge Location |
|---|---|---|
| Line | Left | $XL(T_r) - fh(QL) * T_r * \tan(QL - p/2)$ |
| Line | Right | $XR(T_r) + fh(QR) * T_r * \tan(QR - p/2)$ |
| Space | Left | $XL(T_r) + fh(QL) * T_r * \tan(QL - p/2)$ |
| Space | Right | $XR(T_r) - fh(QR) * T_r * \tan(QR - p/2)$ |

Line or feature center positions are of greatest interest in transverse displacement measurements.

They will be average of left and right edge locations and are in Table 2.101.

TABLE 2.101

Measured Center Locations with Metrology Model.

| Feature | Measured Feature Center Location = XCM |
|---|---|
| Line | $\frac{1}{2}[XL(T_r) + XR(T_r)] - \frac{1}{2}T_r[fh(QL)\cdot\tan(QL - \pi/2) - fh(QR)\cdot\tan(QR - \pi/2)]$ |
| Space | $\frac{1}{2}[XL(T_r) + XR(T_r)] + \frac{1}{2}T_r[fh(QL)\cdot\tan(QL - \pi/2) - fh(QR)\cdot\tan(QR - \pi/2)]$ |

Figure 32B:
FIG. 32b shows resist space notation/geometry.

Looking at FIGS. 32a and 32b for a large feature, each edge forms independently of one another so we would expect that:

$$QR^{space} = QL^{line}$$

$$QL^{space} = QR^{line} \quad \text{Equation 2.109}$$

Furthermore, we would expect the feature center location at the bottom of the resist to be the same or:

$$\frac{1}{2}[XL(T_r) + XR(T_r)]^{space} = \frac{1}{2}[XL(T_r) + XR(T_r)]^{line} \quad \text{Equation 2.110}$$

Both of these expectations are borne out by simulation (Table 8).

TABLE 8

Sample Simulation Results Bearing out Equation 2.109
Symmetry Between Large Line and Large Space Source: Conventional, NAs = 0.4, nxtel(wafer) = 0.05
Exit Pupil: Unobscured, NA = 0.8
Wavelength: 193 nm
Dose: E/E0 = 2
Mask1: 1500 nm line, 2500 nm space
Mask2: 1500 nm space, 2500 nm line
Resist: 0 diffusion, no absorption, nr = 1.75, gamma model (g = 6)

|  | Mask 1 (line) | Mask 2 (space) |
|---|---|---|
| QL | 93.33 | 89.36 |
| QR | 89.34 | 93.33 |
| XC = ½(XL + XR) | 12.8 | 12.76 |
| CD | 1479.89 | 1520.16 |
| CD-CDnom | −20.11 | 20.16 |
| XL | −727.15 | −747.32 |
| XR | 752.74 | 772.84 |
| QR(space) − QL(line) |  | 0 |
| QL(space) − QR(line) |  | 0.02 |

From 2.109 and 2.110, the measured feature location will be the same for both line and space:

$$XCM^{line} = \frac{1}{2}[XL(T_r) + XR(T_r)]^{line} - \quad \text{Equation 2.111}$$

$$\frac{1}{2}T_r\begin{bmatrix} fh(QL^L) \cdot \tan(QL^L - \pi) - \\ fh(QR^L) \cdot \tan(QR^L - \frac{\pi}{2}) \end{bmatrix}$$

$$= \frac{1}{2}[XL(T_r) + XR(T_r)]^{space} -$$

$$\frac{1}{2}T_r\begin{bmatrix} fh(QR^S) \cdot \tan(QR^S - \frac{\pi}{2}) - \\ fh(QL^S) \cdot \tan(QL^S - \frac{\pi}{2}) \end{bmatrix}$$

$$= \frac{1}{2}[XL(T_r) + XR(T_r)]^{space} +$$

$$\frac{1}{2}T_r\begin{bmatrix} fh(QL^S) \cdot \tan(QL^S - \frac{\pi}{2}) - \\ fh(QR^S) \cdot \tan(QR^S - \frac{\pi}{2}) \end{bmatrix}$$

$$= XCM^{space}$$

Figure 33:
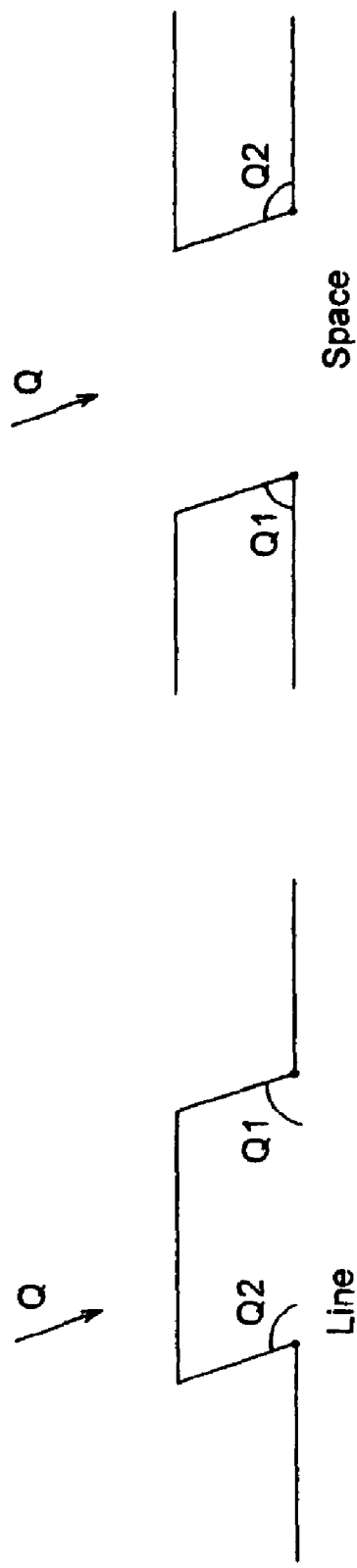
FIG. 33 shows separate line and space patterns formed by light incident on the wafer at substantially angle Q.

Line and space have the same bottom shift, measured shift, and metrology weighting correction. So, once we have our metrology model as represented by fractional height factor fh(Q) we can compensate for metrology induced shifts using Equation 2.111. The line/space symmetry (Equation 2.109) is illustrated in FIG. 33. Light with centroid angle=Q creates large line and a large space. The shift in addition to $$\frac{1}{2}[XL(T_r) + XR(T_r)]$$

from Table 2.101 (metrology shift) for line (ΔXL) and space (ΔXS) is:

$$\Delta XL = \frac{-T_r}{2}\begin{bmatrix} fh(Q2) \cdot \tan(Q2 - \frac{\pi}{2}) \\ -fh(Q1) \cdot \tan(Q1 - \frac{\pi}{2}) \end{bmatrix} \quad \text{Equation 2.111.1}$$

$$\Delta XS = \frac{T_r}{2}\begin{bmatrix} fh(Q1) \cdot \tan(Q1 - \frac{\pi}{2}) \\ -fh(Q2) \cdot \tan(Q2 - \frac{\pi}{2}) \end{bmatrix} \quad \text{Equation 2.111.2}$$

Now, independent of the functional form of fh(Q) the metrology induced shifts (ΔXL and ΔXS of Equations 2.111.1 and 2.111.2) are opposite of one another:

$$\Delta XL = -\Delta XS \quad \text{Equation 2.111}$$

So again, knowing our metrology model parameters (fh (Q1)) allows us to remove metrology induced shifts (Equations 2.111.1 and 2.111.2) from our BB measurement results.

11$^{th}$ and 12$^{th}$ Embodiments

Figure 34:
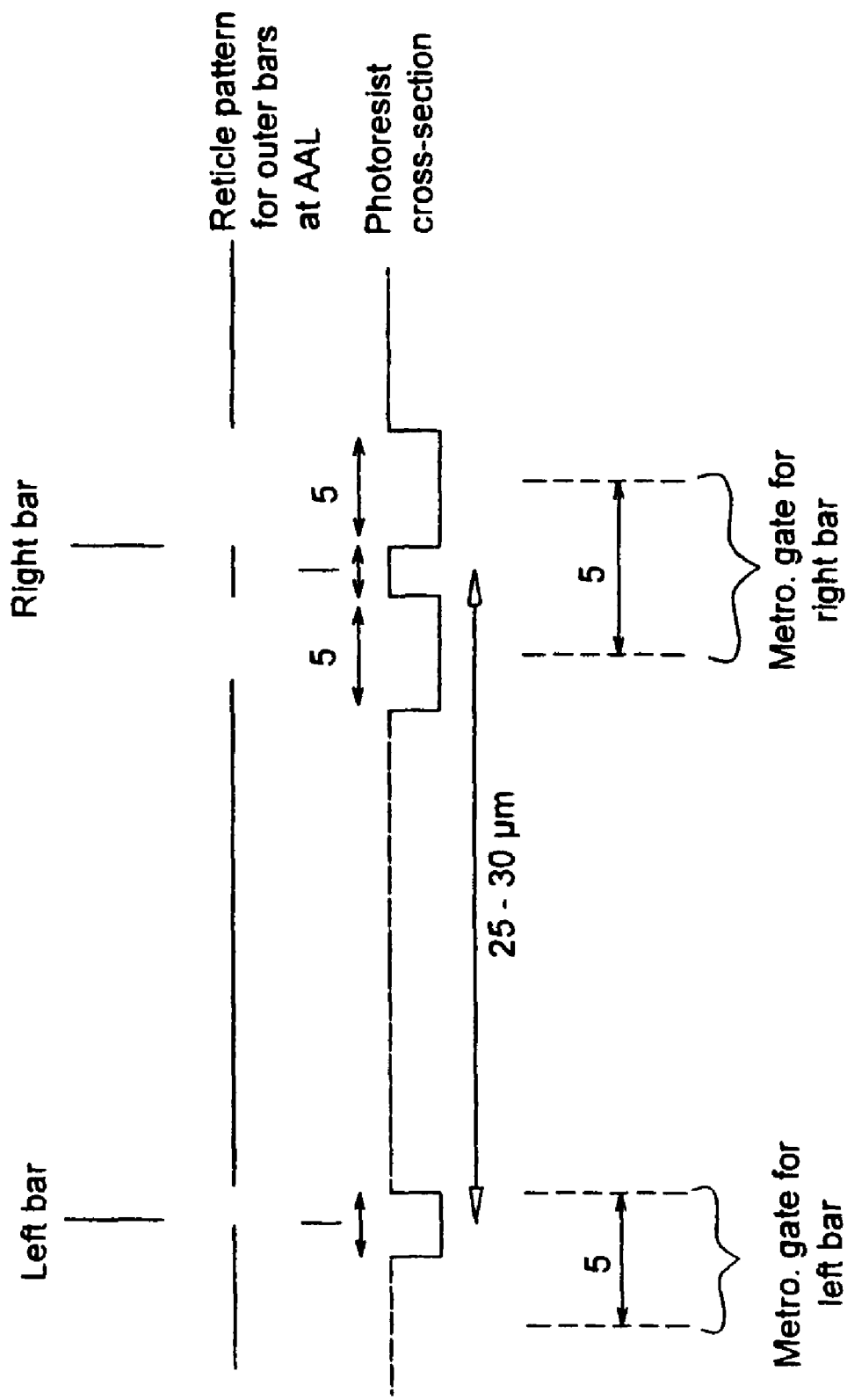
FIG. 34 shows example out bar pattern for cancellation metrology induced shift in features being made at an angle.
Figure 35:
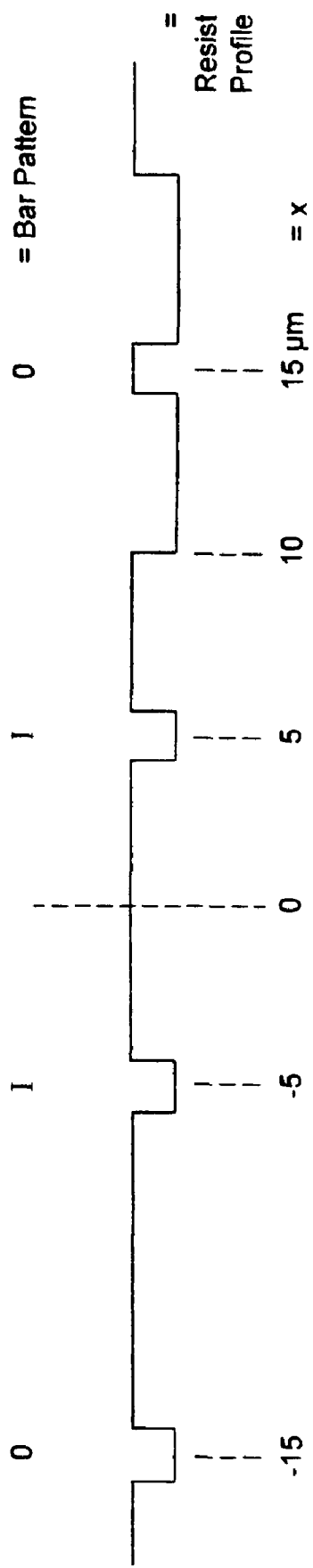
FIG. 35 shows the completed bar-in-bar pattern where metrology effect on the outer bar pair has been eliminated.

Intrinsic Removal of the Metrology Effect for Both Source and Exit Pupil Divisions:

Now, one arrangement that suggests itself and allows for elimination or effective removal of the metrology induced shift consists of creating line and space patterns simultaneously for the inner (or outer) set of bars. If in, say, the left alignment attribute (AAL) in FIG. 21 we look at the reticle in cross-section PP, its side view would be as in the top of FIG. 34. The left bar would consist of an isolated large space (prints at ~1 μm at wafer) while the right bar would consist of an isolated large line (~1 μm at wafer). When setting up the metrology gates, the right bar gates could be well inside the ~5 μm cleared resist area on each side of the right isolated line. Then, $$\Delta X = \text{shift of bar pair of FIG. 34} \quad \text{Equation 2.112}$$

$$= \frac{1}{2}\left\{ \begin{array}{l} \frac{1}{2}[XL(T_r) + XR(T_r)]^{space} + \Delta XL + \\ \frac{1}{2}[XL(T_r) + XR(T_r)]^{line} + \Delta XS \end{array} \right\}$$

$$= \frac{1}{2}\left\{ \begin{array}{l} \frac{1}{2}[XL(T_r) + XR(T_r)]^{space} + \\ \frac{1}{2}[XL(T_r) + XR(T_r)]^{line} \end{array} \right\}$$

because of Equation 2.111.

The importance of Equation 2.112 is it completely eliminates the metrology effect (fh(Q)) and our having to otherwise measure and calibrate it out. This arrangement could be applied to ISI patterns (U.S. Pat. No. 5,828,455) to eliminate metrology effects.

13th and 14th Embodiments

Intrinsic Removal Using Bright and Dark Field Imaging

Figure 36:
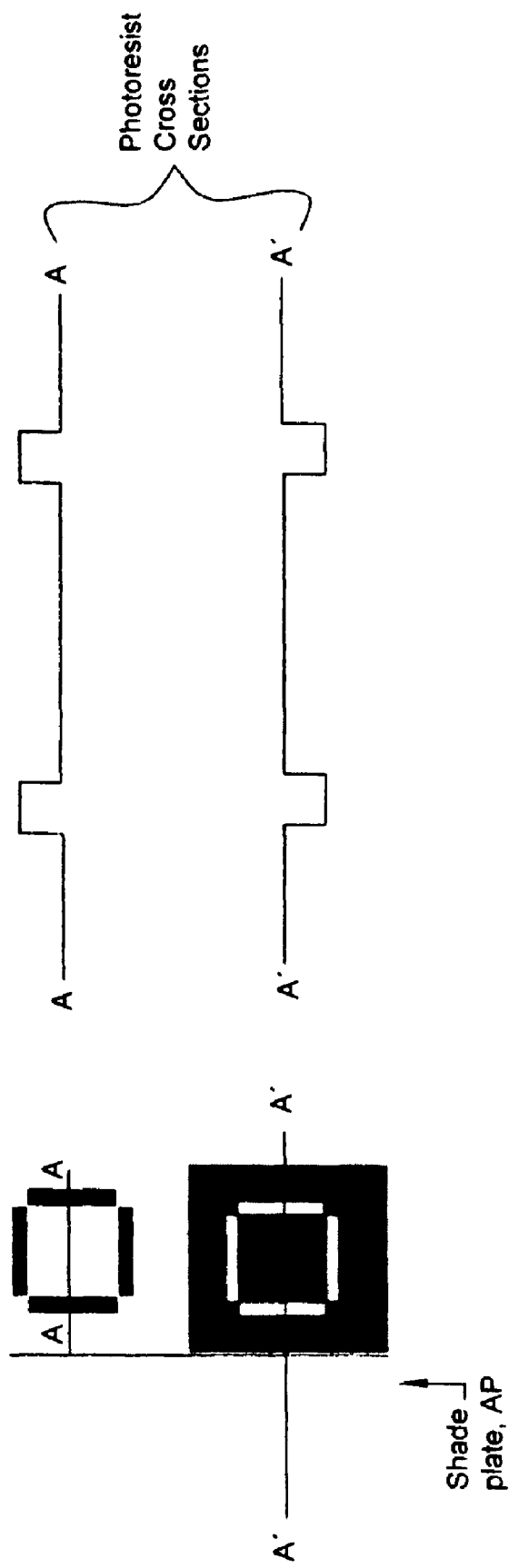
FIG. 36 shows the opposite polarity bar-in-bar patterns for cancelling out metrology shift.

Another arrangement for canceling metrology shift utilizes pairs of alignment attributes of opposite polarity i.e., line and space disposed along the same edge of aperture plate AP (FIG. 36). This requires measuring twice as many BB patterns and averaging the results but again eliminates the need for a metrology model.

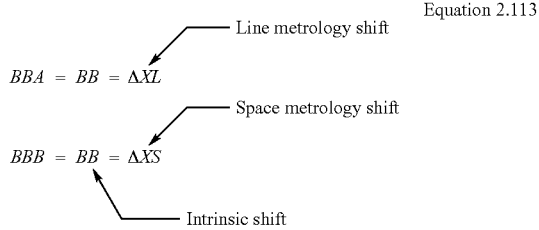

Equation 2.113

Average of line and space pattern gives us intrinsic shift only:

$$\frac{1}{2}(BBA + BBB) = BB + \underbrace{\frac{1}{2}(\Delta XL + \Delta XS)}_{0} = BB \qquad \text{Equation 2.114}$$

15th and 16th Embodiments

Determination of Precision Bossung Curves

Measurement of Precision Bossung Curves

Figure 37:
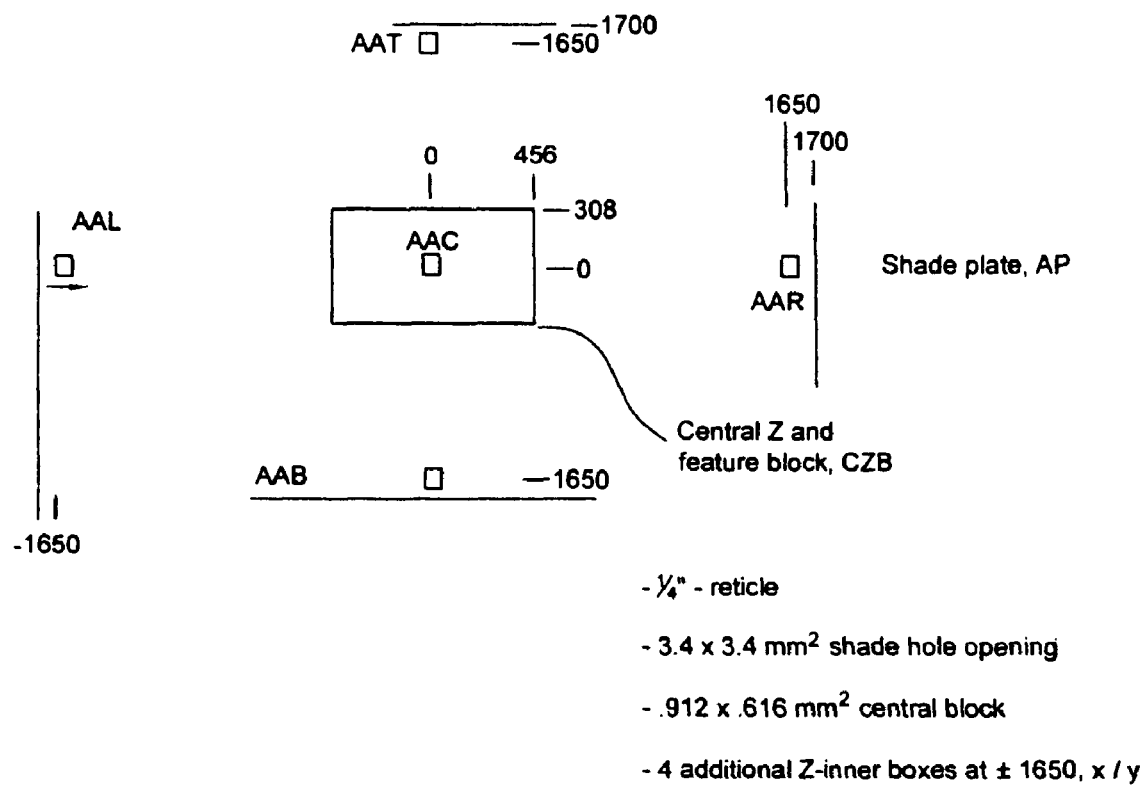
FIG. 37 shows the unit field point layout for Lithographic Test Reticle (LTR)
Figure 38:
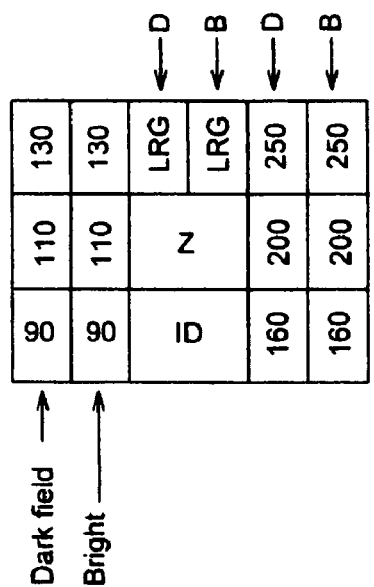
FIG. 38 shows the schematic layout of CZB block in Lithographic Test Reticle (LTR)
Figure 39:
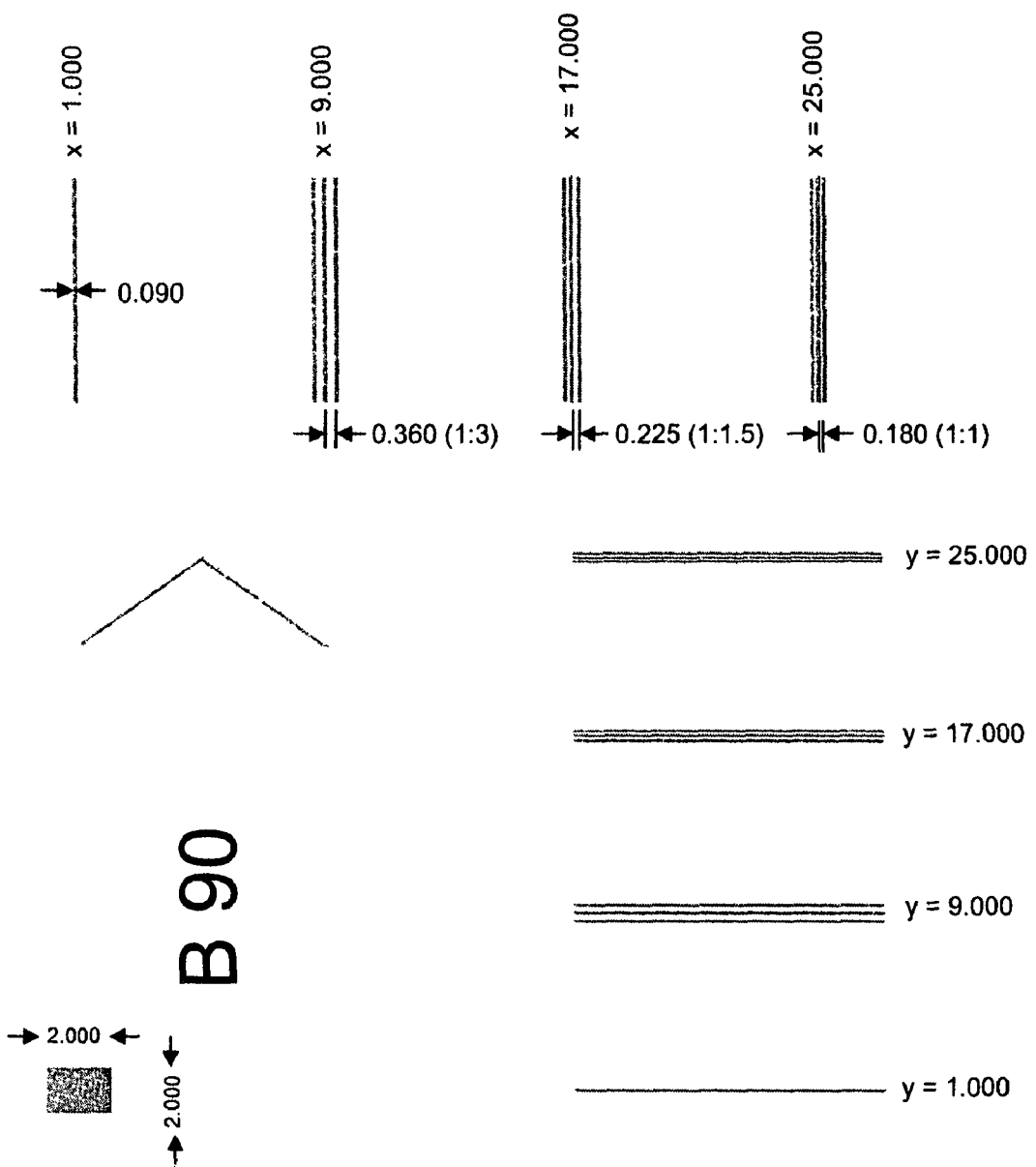
FIG. 39 shows sample bright field, 90 nm node test structures within CZB.

Bossung curves or CD/shift versus focus at varying dose levels are the quantitative starting point for semiconductor process monitoring and control (see background above). They can be emulated (see e.g. U.S. Publication No. 2005/0240895) but are typically directly measured using CD-SEM and/or overlay tool. FIG. 30 shows a typical set of Bossung curves, in this case simulated. Now, due to wafer surface height variation, focus drift and jitter, the nominal focus value, especially relative to the top of the photoresist, is typically the least certain portion of experimental Bossung curve determination. Combining the source or exit pupil division arrangements (see above embodiments) with product features or test structures can greatly increase the speed and accuracy of Bossung curve determination. A unit cell arrangement useful out to NA=0.95 in a source division layout is shown in FIG. 37. It consists of a ZF structure with four clipped alignment attributes (AAL, AAR, AAT, AAB) and one central unclipped alignment attribute, AAC. There is a central feature and block, CZB, potentially as large as 0.912× 0.912 mm² that contains AAC and any product or test structures. CZB is located far enough away from occluding edges of aperture place AP that all structures within CZB are unaffected by it. This means that like AAC, they will not have the source or entrance pupil blocked by AP and these features will print just as they would on a reticle not having aperture plate AP. The presence of aperture plate and AAL, AAR, AAT, AAB and AAC structures lets us precisely determine the exact state of focus and telecentricity present when product/test features in CZB print.

So doing the usual CD measurements accompanied by F determination permits experimental evaluation of Bossung curves.

17th and 18th Embodiments

Determining Focus Error Components and Source Boresighting Error using Source or Exit Division So far we have discussed using the ZTEL (box-in-box) targets—using Source or Exit Pupil Division to determine both focus and source telecentricity—possibly in the presence of both entrance and exit pupil telecentricity errors. The focus (z-height variation) so far described in the preferred embodiment also known again as focal plane deviation or FPD (once known over the exposure field). As described in U.S. Publication No. 2005/0243309 and U.S. Pat. No. 7,126,668 one can determine the focus error associated with the lens and other sources such as wafer non-flatness and scanner noise using various types of focusing fiducials such as: PSM structures (Reference 459), Schnitzel Targets, FOCAL monitors, and ISI targets (see U.S. Pat. No. 5,828,455). These focusing monitors—mentioned in U.S. Publication No. 2005/0243309 and U.S. Pat. No. 7,126,668—can be added to the reticle patterns described in the above preferred embodiment and performed in parallel with the present invention in order to extract the individual error components related to both FPD and telecentricity. FIG. 40 shows a decision tree flow diagram for each of the embodiments described above.

While the present invention has been described in conjunction with specific preferred embodiments, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

The invention claimed is:

1. A method for determining focus and source telecentricity for a lithographic projection machine comprising:
   providing a reticle containing arrays of box-in-box test structures and aperture plate for exit pupil division, said box-in-box test structures comprising at least one set of large featured alignment attributes and one set of small featured alignment attributes;
   exposing at least one array of the box-in-box test structures;
   shifting wafer stage to align reference arrays over the box-in-box test structures;
   exposing the reference arrays;
   measuring the resulting exposure patterns with an overlay tool; and
   entering overlay data into an analysis engine, wherein the analysis engine is configured to solve for focus and source telecentricity.

2. The method of claim 1, wherein the lithographic projection machine is selected from a group consisting of a stepper and a scanner.

3. The method of claim 1, wherein the exposure includes exposing extra dose structures.

4. The method of claim 1, wherein the overlay data is corrected for aberrations.

5. The method of claim 1, wherein the overlay data is corrected for metrology error.

6. The method of claim 1, wherein the analysis engine is configured to solve for exit pupil telecentricity from the overlay data.

7. The method of claim 1, wherein the analysis engine is configured to solve for entrance pupil telecentricity from the overlay data.

8. The method of claim 1, wherein the said reticle is configured for source division.

9. The method of claim 1, wherein the analysis engine includes lithography simulation.

10. A method for producing an optimized photolithographic chip mask work from a lithographic projection machine and process, the method comprising:

determining a focus result and a source telecentricity result wherein the determining stem comprises:

providing a reticle containing arrays of box-in-box test structures and aperture plate for exit pupil division, said box-in-box test structures comprising at least one set of large featured alignment attributes and one set of small featured alignment attributes;

exposing at least one array of the box-in-box test structures;

shifting wafer stage to align reference arrays over the box-in-box test structures;

exposing the reference arrays;

measuring the resulting exposure patterns with an overlay tool; and entering overlay data into an analysis engine, wherein the analysis engine is configured to determine focus and source telecentricity;

entering the focus and the source telecentricity results into a machine simulator or controller;

determining optimum operation conditions related to the machine and process to reflect the optimized conditions; and exposing product wafer(s) using the optimized conditions.

11. A method for producing an optimized photolithographic chip mask work from a lithographic projection machine and process, the method comprising:

determining focus and source telecentricity, wherein the determining step comprises:

providing a reticle containing arrays of box-in-box test structures and aperture plate for exit pupil division, said box-in-box test structures comprising at least one set of large featured alignment attributes and one set of small featured alignment attributes;

exposing at least one array of the box-in-box test structures;

shifting wafer stage to align reference arrays over the box-in-box test structures;

exposing the reference arrays;

measuring the resulting exposure patterns with an overlay tool; and entering overlay data into an analysis engine, wherein the analysis engine is configured to determining focus and source telecentricity;

entering the focus and source telecentricity results into a machine simulator or controller;

determining precision Bossung curves related to the machine and process; and exposing product wafer(s) using the precision Bossung curves.

* * * * *